United States Patent
Ayai et al.

(10) Patent No.: US 10,355,620 B2
(45) Date of Patent: Jul. 16, 2019

(54) CONVERSION DEVICE

(71) Applicant: Sumitomo Electric Industries, Ltd., Osaka-shi (JP)

(72) Inventors: Naoki Ayai, Osaka (JP); Toshiaki Okumura, Osaka (JP); Tetsuo Akita, Osaka (JP); Kenji Abiru, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 224 days.

(21) Appl. No.: 15/519,417

(22) PCT Filed: Dec. 19, 2014

(86) PCT No.: PCT/JP2014/083731
§ 371 (c)(1),
(2) Date: Apr. 14, 2017

(87) PCT Pub. No.: WO2016/059734
PCT Pub. Date: Apr. 21, 2016

(65) Prior Publication Data
US 2017/0229978 A1    Aug. 10, 2017

(30) Foreign Application Priority Data
Oct. 17, 2014    (JP) .................................. 2014-212899

(51) Int. Cl.
*H02J 7/00* (2006.01)
*H03H 7/01* (2006.01)
(Continued)

(52) U.S. Cl.
CPC ........... *H02M 7/539* (2013.01); *H02J 7/0063* (2013.01); *H02M 1/12* (2013.01); *H02M 1/126* (2013.01);
(Continued)

(58) Field of Classification Search
None
See application file for complete search history.

(56) References Cited

U.S. PATENT DOCUMENTS

2006/0156096 A1    7/2006  Sato
2006/0250831 A1   11/2006  Li et al.
(Continued)

FOREIGN PATENT DOCUMENTS

EP    1039620 A2    9/2000
EP    1753634 B1    5/2010
(Continued)

OTHER PUBLICATIONS

Office Action issued in U.S. Appl. No. 15/032,197, dated May 19, 2017.
(Continued)

*Primary Examiner* — Jared Fureman
*Assistant Examiner* — Aqeel H Bukhari
(74) *Attorney, Agent, or Firm* — Baker Botts L.L.P.; Michael A. Sartori

(57) ABSTRACT

This conversion device converts DC powers from a plurality of DC power supplies, to AC power and supplies the AC power to a load. The conversion device includes: a filter circuit including an AC reactor and a first capacitor; a DC/AC inverter connected to the load via the filter circuit; DC/DC converters provided between the respective plurality of DC power supplies and the DC/AC inverter; a second capacitor provided between the DC/AC inverter and the DC/DC converters; and a control unit configured to set a current target value for each of the DC/DC converters to thereby be synchronized with current of the AC power, based on voltage of the AC power, voltage variation due to current flowing through the AC reactor and an impedance thereof, reactive currents respectively flowing through the
(Continued)

first capacitor and the second capacitor, and voltage of each DC power.

10 Claims, 20 Drawing Sheets

(51) Int. Cl.
*H02M 1/12* (2006.01)
*H02M 7/539* (2006.01)
*H02M 3/155* (2006.01)
*H02M 7/48* (2007.01)
*H02S 40/32* (2014.01)
*H02M 3/156* (2006.01)
*H02M 1/00* (2006.01)
*H02J 7/35* (2006.01)

(52) U.S. Cl.
CPC ........... *H02M 3/155* (2013.01); *H02M 3/156* (2013.01); *H02M 7/48* (2013.01); *H02S 40/32* (2014.12); *H03H 7/0115* (2013.01); *H02J 7/35* (2013.01); *H02M 2001/009* (2013.01); *H02M 2001/0048* (2013.01); *Y02B 70/1491* (2013.01)

(56) References Cited

U.S. PATENT DOCUMENTS

| | | | |
|---|---|---|---|
| 2008/0150366 | A1 | 6/2008 | Adest et al. |
| 2009/0121549 | A1 | 5/2009 | Leonard |
| 2009/0140577 | A1 | 6/2009 | Fishman |
| 2010/0091532 | A1 | 4/2010 | Fornage |
| 2010/0156186 | A1* | 6/2010 | Kim ................ H01M 16/003 307/72 |
| 2012/0134191 | A1 | 5/2012 | Yoneda |
| 2012/0201064 | A1 | 8/2012 | Asakura et al. |
| 2013/0002031 | A1* | 1/2013 | Mulkey ................ H02J 3/385 307/82 |
| 2013/0009482 | A1* | 1/2013 | Okui ................ H02J 3/24 307/66 |
| 2014/0070619 | A1 | 3/2014 | Fornage |
| 2014/0085953 | A1 | 3/2014 | Mao |
| 2014/0104907 | A1 | 4/2014 | Shimada et al. |
| 2016/0126742 | A1 | 5/2016 | Ayai et al. |
| 2016/0126863 | A1 | 5/2016 | Ayai et al. |
| 2016/0268890 | A1 | 9/2016 | Ayai et al. |

FOREIGN PATENT DOCUMENTS

| | | |
|---|---|---|
| EP | 2693288 A1 | 2/2014 |
| EP | 3093972 A1 | 11/2016 |
| JP | 62-200413 A | 9/1987 |
| JP | 08-044446 A | 2/1996 |
| JP | 2000-152651 A | 5/2000 |
| JP | 2000-341862 A | 12/2000 |
| JP | 2002-369544 A | 12/2002 |
| JP | 2002-374681 A | 12/2002 |
| JP | 2003-009537 A | 1/2003 |
| JP | 2003-134667 A | 5/2003 |
| JP | 2003-289626 A | 10/2003 |
| JP | 2003-348768 A | 12/2003 |
| JP | 2005-204485 A | 7/2005 |
| JP | 2005-218157 A | 8/2005 |
| JP | 4195948 B2 | 12/2008 |
| JP | 4200244 B2 | 12/2008 |
| JP | 4379959 B2 | 12/2009 |
| JP | 2010-066919 A | 3/2010 |
| JP | 4468371 B2 | 5/2010 |
| JP | 4487354 B2 | 6/2010 |
| JP | 4622021 B2 | 2/2011 |
| JP | 2011-083170 A | 4/2011 |
| JP | 2012-055036 A | 3/2012 |
| JP | 5618022 B1 | 11/2014 |
| JP | 5618023 B1 | 11/2014 |
| WO | 2006/033142 A1 | 3/2006 |

OTHER PUBLICATIONS

Davis, "SiC Transistor Basics: FAQs" Retrieved from http://www.powerelectronics.com/print/11365, XP055408593, Oct. 9, 2013, 9 Pages. [Cited in ESSR].
Notice of Allowance issued in U.S. Appl. No. 15/032,197, dated Oct. 20, 2017.
Office Action issued in U.S. Appl. No. 14/891,292 dated Jun. 4, 2018.
Office Action in counterpart Japanese Patent Application No. 2014-104326, dated Jun. 24, 2014.
International Search Report in International Application No. PCT/JP2014/063606, dated Jul. 15, 2014.
Patent Examination Report No. 1 in Australian Patent Application No. 2014279387, dated Jan. 28, 2016.
International Search Report in International Application No. PCT/JP2014/083736, dated Mar. 17, 2015.
International Search Report in International Application No. PCT/JP2014/063610, dated Jul. 15, 2014.
International Search Report in counterpart International Application No. PCT/JP2014/083731, dated Mar. 17, 2015.
U.S. Appl. No. 14/891,292, filed Nov. 13, 2015.
U.S. Appl. No. 15/032,197, filed Apr. 26, 2016.
U.S. Appl. No. 14/890,882, filed Nov. 12, 2015.
Wang et al., "Novel Three-Phase Three-Level-Stacked Neutral Point Clamped Grid-Tied Solar Inverter With a Split Phase Controller," IEEE Transactions on Power Electronics, Institute of Electrical and Electronics Engineers, USA, vol. 28, No. 6, Jun. 1, 2013, pp. 2856-2866, XP011476364, ISSN; 0885-8993, DOI:10.1109/TPEL.2012.2226475 [Cited in Search Report issued in counterpart European Patent Application No. 14 903 937.2, dated May 14, 2018.].
Notice of Allowance issued for U.S. Appl. No. 14/891,292 dated Dec. 17, 2018.
Notice of Allowance issued in U.S. Appl. No. 14/891,292 dated Dec. 17, 2018.

* cited by examiner

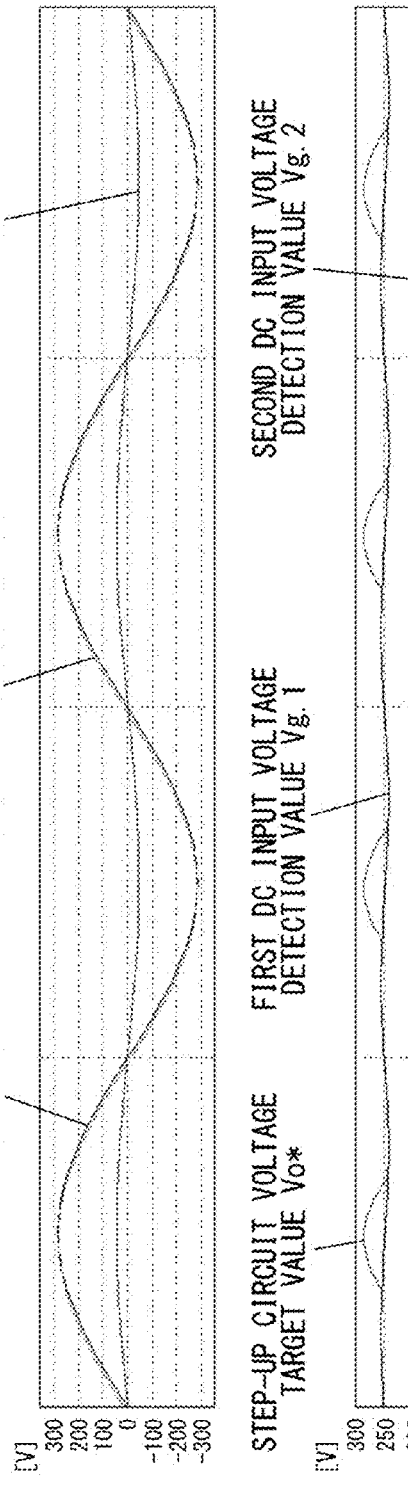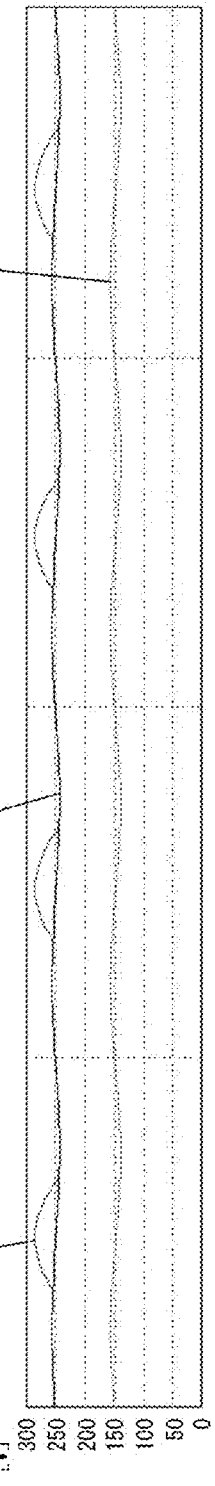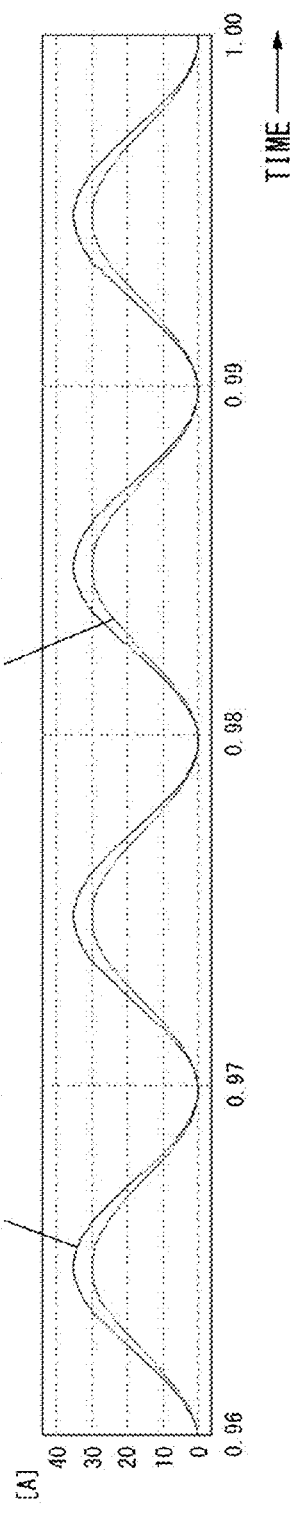
FIG. 10

CONVERSION DEVICE

TECHNICAL FIELD

The present invention relates to a conversion device that performs conversion from DC to AC or conversion from AC to DC.

BACKGROUND ART

Conversion devices that convert DC voltage outputted from a storage battery to AC voltage and provide the AC voltage to a load are often used as a backup power supply such as a UPS (Uninterruptible Power Supply) (see, for example, Patent Literature 1 (FIG. 1)). Such a conversion device includes a DC/DC converter for stepping up voltage of the storage battery and an inverter for performing conversion from DC to AC. The conversion device is capable of bidirectional operation, and normally, converts AC voltage outputted from an AC power supply such as a commercial power supply, to DC voltage adapted for charging, and charges the storage battery. In this case, the inverter operates as an AC/DC converter, and the DC/DC converter performs step-down operation.

A conversion device (power conditioner) is used also for converting DC power obtained from a DC power supply such as photovoltaic generation to AC power and performing system interconnection with an AC power system (see, for example, Patent Literature 2).

CITATION LIST

Patent Literature

PATENT LITERATURE 1: Japanese Laid-Open Patent Publication No. 2003-348768
PATENT LITERATURE 2: Japanese Laid-Open Patent Publication No. 2000-152651
PATENT LITERATURE 3: Japanese Laid-Open Patent Publication No. 2003-134667

SUMMARY OF INVENTION

Technical Problem

In the above conventional conversion device, the AC/DC converter and the DC/DC converter are both composed of switching elements, and constantly perform high-speed switching. Such switching elements are accompanied with slight switching loss. Although loss in one switching is slight, high-frequency switching of a plurality of switching elements causes switching loss that cannot be neglected as a whole. The switching loss naturally leads to power loss.

On the other hand, as a conversion device from DC to AC, it is proposed that a DC/DC converter and an inverter are operated to alternately perform high-frequency switching, thereby reducing switching loss (see Patent Literature 2).

However, for example, in a case of using a photovoltaic panel as the DC power supply, a plurality of solar battery arrays each composed of a plurality of connected photovoltaic panels may be connected in parallel to the conversion device (see, for example, Patent Literature 3). In this case, since the solar battery arrays may have different optimum operation points, the DC/DC converter is prepared for each solar battery array. Thus, it is possible to, by each DC/DC converter, control the operation point of the corresponding solar battery array so as to be optimized.

However, under the configuration in which a plurality of DC/DC converters are provided, in a case of performing control so that switching operations of the DC/DC converters and the inverter are alternately stopped as proposed in Patent Literature 2, power to be given to the inverter when switching of the DC/DC converters is stopped is supplied from only an array that is outputting power with the highest voltage among the arrays. As a result, supply of power cannot be obtained from the other arrays having relatively low voltages. Thus, the power generation efficiency deteriorates.

The same situation is assumed also in a case where a plurality of storage batteries are connected to a conversion device including a plurality of DC/DC converters and conversion from AC to DC is performed. For example, in a case where the charge states of the storage batteries are different, it is desired to charge the individual storage batteries by the respective DC/DC converters, but during a period in which each DC/DC converter stops switching, a case where the storage battery cannot be charged appropriately can happen. Thus, the power generation efficiency deteriorates.

In view of the above problems, an object of the present invention is to, in a conversion device including DC/DC converters corresponding to the respective plurality of DC power supplies, achieve a high conversion efficiency by reducing switching loss and effectively utilize the plurality of DC power supplies.

Solution to Problem

A conversion device of the present invention is a conversion device that converts DC powers from a plurality of DC power supplies, to AC power and supplies the AC power to a load, the conversion device including: a filter circuit connected to the load and including an AC reactor and a first capacitor; a DC/AC inverter connected to the load via the filter circuit; a plurality of DC/DC converters as a whole, which are provided between the respective plurality of DC power supplies and the DC/AC inverter; a second capacitor provided between the DC/AC inverter and the plurality of DC/DC converters; and a control unit configured to set a current target value for each of the plurality of DC/DC converters to thereby be synchronized with current of the AC power, based on voltage of the AC power, voltage variation due to current flowing through the AC reactor and an impedance thereof, reactive currents respectively flowing through the first capacitor and the second capacitor, and voltage of each DC power.

Advantageous Effects of Invention

The conversion device of the present invention can achieve a high conversion efficiency and can effectively utilize the plurality of DC power supplies.

BRIEF DESCRIPTION OF DRAWINGS

FIG. 10 is graphs showing a simulation result of temporal variations in the DC input voltage detection values Vg.1 and Vg.2 and the step-up circuit voltage target value Vo*, together with each target value, in which an upper graph shows a relationship between the inverter output voltage target value Vinv* and a system voltage detection value Va, a middle graph shows a relationship between the DC input voltage values Vg.1 and Vg.2 and the step-up circuit voltage target value Vo*, and a lower graph shows step-up circuit current target values Iin.1* and Iin.2*.

DESCRIPTION OF EMBODIMENTS

[Summary of Embodiments]

Figure 1:
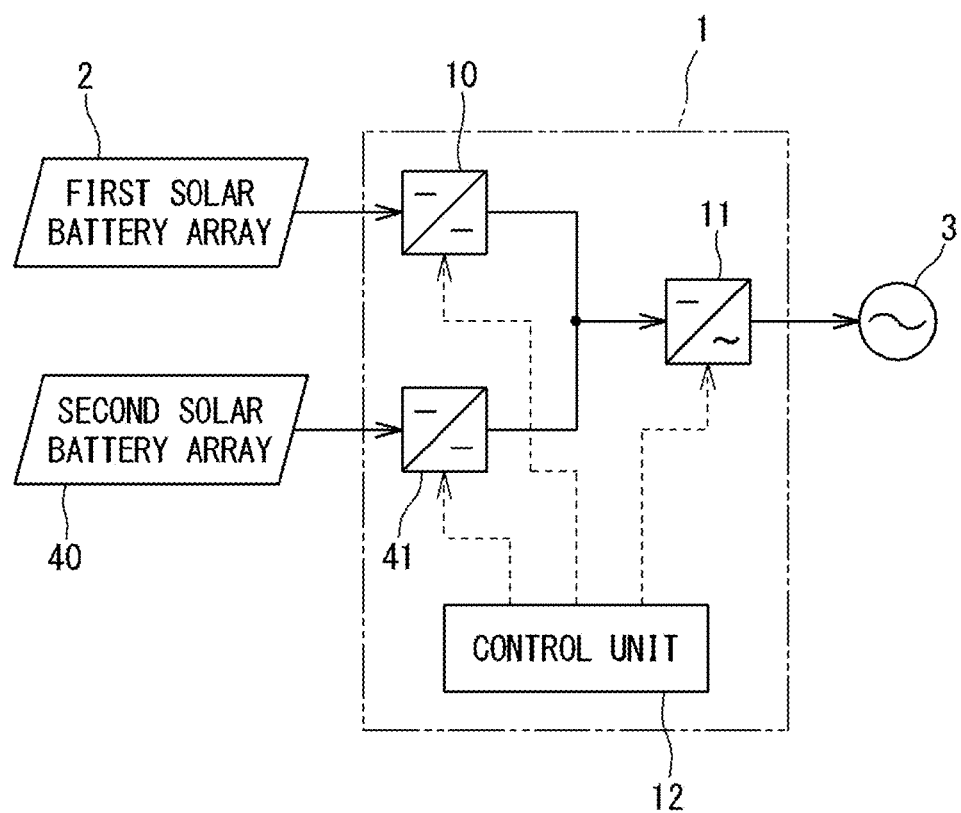
FIG. 1 is a block diagram showing an example of a system including an inverter device according to one embodiment.

Summary of the embodiments of the present invention includes at least the following.

(1) This is a conversion device that converts DC powers from a plurality of DC power supplies, to AC power and supplies the AC power to a load, the conversion device including: a filter circuit connected to the load and including an AC reactor and a first capacitor; a DC/AC inverter connected to the load via the filter circuit; a plurality of DC/DC converters as a whole, which are provided between the respective plurality of DC power supplies and the DC/AC inverter; a second capacitor provided between the DC/AC inverter and the plurality of DC/DC converters; and a control unit configured to set a current target value for each of the plurality of DC/DC converters to thereby be synchronized with current of the AC power, based on voltage of the AC power, voltage variation due to current flowing through the AC reactor and an impedance thereof, reactive currents respectively flowing through the first capacitor and the second capacitor, and voltage of each DC power.

In such a conversion device, the DC/AC inverter and at least one of the DC/DC converters each perform high-frequency switching a minimum necessary number of times. In addition, the DC/AC inverter operates in a region other than the peak of the amplitude of AC voltage and the vicinity thereof, and the DC/DC converter operates in a region other than the zero cross point of AC voltage and the vicinity thereof. Therefore, in high-frequency switching, voltages applied to the semiconductor elements of each converter and the reactor are relatively reduced. This also contributes to reduction in switching loss in the semiconductor elements and iron loss in the reactor. Thus, the entire loss in the conversion device can be reduced. In the conversion device, the load may be an AC system to which an AC power supply is connected, and conversion for system interconnection from the DC power supply to the AC system can be performed with high efficiency. In order to achieve the "minimum necessary number of times" as described above, ideally, it is preferable that the DC/AC inverter and the DC/DC converter alternately perform high-frequency switching so that their respective periods of high-frequency switching do not overlap each other. However, in practice, even if both periods slightly overlap each other, as long as a stop period is provided for each of the DC/AC inverter and the DC/DC converter, the loss can be reduced, leading to enhancement in the efficiency.

Based on voltage of AC power, voltage variation due to current flowing through the AC reactor and the impedance thereof, reactive currents flowing through the first and second capacitors, and voltage of each DC power, each current target value for the plurality of DC/DC converters is set to be synchronized with current of AC power, whereby the conversion device can output current that is constantly synchronized with the AC voltage (or controlled at a given phase angle relative to the AC voltage) and has no distortion, irrespective of variation in the voltage, frequency, and output current of the AC power.

(2) In the conversion device of (1), the plurality of DC power supplies may include at least one of a solar battery array and a storage battery, and the control unit may set, based on the current target values, current target values to be allocated to the respective DC/DC converters, thereby causing the DC power supply that is the solar battery array to perform corresponding output and causing the DC power supply that is the storage battery to be charged or discharged accordingly.

In this case, the current target values can be appropriately set in accordance with the power generation condition of each solar battery array and the charge state of each storage battery.

(3) In the conversion device of (1) or (2), in a case where a number corresponding to each of the plurality of DC power supplies is i (=1, 2, . . . ), a target value for output current from each DC power supply to the load is Ia.i*, a capacitance of the first capacitor is Ca, a voltage value of the AC power is Va, voltage based on each of the plurality of DC power supplies is $V_{DC}.i$, and a Laplace operator is s, the control unit may set an AC output current target value Iinv* for the DC/AC inverter at a circuit connection point between the filter circuit and the DC/AC inverter, to a value obtained by adding reactive current flowing through the first capacitor and a summation of Ia.i*, in a case where an impedance of the AC reactor is Za, the control unit may set an AC output voltage target value Vinv* for the DC/AC inverter at the circuit connection point, as follows:

$$Vinv^* = Va + ZaIinv^*,$$

the control unit may set the greater one of the voltage $V_{DC}.i$ and an absolute value of the AC output voltage target value Vinv* for the DC/AC inverter, as an output voltage target value Vo* for the DC/DC converter, and in a case where a capacitance of the second capacitor is C, the control unit may set a current target value Iin.i* for the DC/DC converter, as follows:

$$Iin.i^* = [Ia.i^* \times Vinv^* + Ki\{(sCaVa)Vinv^* + (sCVo^*) \times Vo^*\}]/V_{DC}.i$$

where Ki is a given group of constants that satisfies ΣKi=1.

The conversion device of the above (3) is an example showing a more specific control technique for achieving the conversion device of (1). In the current target value Iin.i* for each DC/DC converter, voltage of AC power, voltage variation due to current flowing through the AC reactor and the impedance thereof, reactive currents flowing through the first and second capacitors, and voltage of each DC power are all reflected, and irrespective of variation in voltage of each DC power supply or variation in the AC output current, power synchronized with the AC output current can be constantly outputted. Therefore, each DC/DC converter and the DC/AC inverter can perform conversion from AC to DC while performing high-frequency switching a minimum necessary number of times. Thus, switching loss in semiconductor switching elements and iron loss in an AC reactor and a DC reactor can be greatly reduced, and a high conversion efficiency can be achieved. Further, outputted AC power has a high quality, and current with distortion that is sufficiently small for interconnection with the commercial system can be obtained.

(4) In the conversion device of any one of (1) to (3), the plurality of DC/DC converters may each include a DC reactor, and voltage obtained by subtracting voltage variation due to current flowing through each DC reactor and an impedance thereof from voltage Vg.i of each DC power supply may be used as voltage of each DC power or voltage $V_{DC}.i$.

In this case, since voltage drop due to the current and impedance of the DC reactor is also considered, it is possible to constantly perform accurate control irrespective of variation in current flowing through each DC/DC converter.

(5) In the conversion device of any one of (1) to (4), the load may be an AC power supply.

In this case, although voltage of the AC power becomes voltage of the AC power supply, since the control unit is provided which sets the current target value for each DC/DC converter to thereby be synchronized with current of the AC power, so-called system interconnection operation can be performed.

(6) In the conversion device of (5), power may be supplied from the AC power supply to at least one of the plurality of DC power supplies.

In this case, as for the input current target value from the AC power supply to the DC power supply, although Ia.i* becomes current having a phase inverted from the phase of voltage of the AC power supply as seen from the DC side, the calculation expressions described in (3) are applicable as they are. That is, the conversion device of (1) to (6) can be used as a bidirectional conversion device which not only converts DC power of each DC power supply to AC power but also converts AC power of the AC power supply to DC power. It is also possible that some of the plurality of DC power supplies are operated as sources for generating DC power and the other DC power supplies are operated as DC loads that absorb the DC power.

(7) In the conversion device of any one of (1) to (6), an SiC element may be used for at least one of semiconductor switching elements included in the plurality of DC/DC converters and the DC/AC inverter.

In the conversion device described in (1) to (6), switching loss in the semiconductor elements and iron loss in the DC reactor and the AC reactor can be reduced by decrease in the number of times of high-frequency switching, but conduction loss in the semiconductor elements cannot be reduced. In this regard, using SiC elements as the semiconductor elements enables reduction in the conduction loss. Therefore, by combining this feature with the conversion device described in (1) to (6), a high conversion efficiency can be achieved by the synergistic effect therebetween.

[Details of Embodiments]

Hereinafter, embodiments of the present invention will be described with reference to the drawings.

«DC-to-AC Conversion Device with System Interconnection Function»

First, a DC-to-AC conversion device with a system interconnection function (hereinafter, simply referred to as an inverter device) will be described in detail.

[1 Overall Configuration]

FIG. 1 is a block diagram showing an example of a system including an inverter device according to one embodiment. In FIG. 1, a first solar battery array 2 and a second solar battery array 40 as DC power supplies are connected to an input end of an inverter device 1, and an AC commercial power system 3 (AC system) is connected to an output end of the inverter device 1.

This system performs interconnection operation to convert DC power generated by the first solar battery array 2 (hereinafter, may be simply referred to as a first array 2) and the second solar battery array 40 (hereinafter, may be simply referred to as a second array 40), to AC power, and output the AC power to the commercial power system 3.

The first array 2 and the second array 40 are each composed of a plurality of photovoltaic panels (modules) connected in series and parallel. In the present embodiment, the second array 40 is configured such that voltage of power outputted from the second array 40 is smaller than voltage of power outputted from the first array 2.

The inverter device 1 includes a first step-up circuit (DC/DC converter) 10 which receives DC power outputted from the first array 2, a second step-up circuit (DC/DC converter) 41 which receives DC power outputted from the second array 40, an inverter circuit (DC/AC converter) 11 which converts powers given from both step-up circuits 10 and 41 to AC power and outputs the AC power to the commercial power system 3, and a control unit 12 which controls operations of these circuits 10, 11, and 41.

The first step-up circuit 10 and the second step-up circuit 41 are connected in parallel to the inverter circuit 11.

Figure 2:
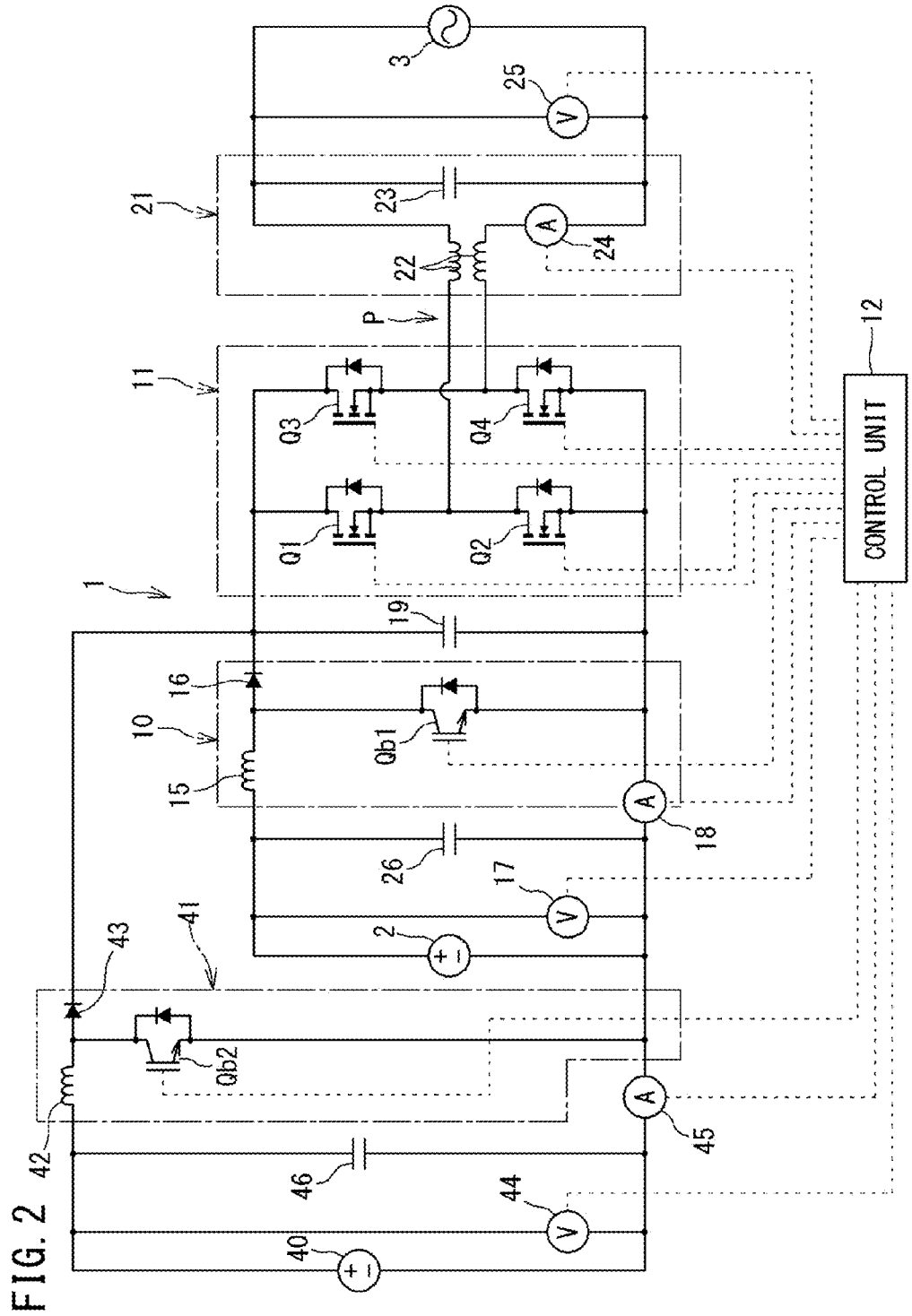
FIG. 2 shows an example of a circuit diagram of the inverter device.

FIG. 2 shows an example of a circuit diagram of the inverter device 1.

The first step-up circuit 10 to which the first array 2 is connected includes a DC reactor 15, a diode 16, and a switching element Qb1 composed of an Insulated Gate Bipolar Transistor (IGBT) or the like, to form a step-up chopper circuit.

On an input side of the first step-up circuit 10, a first voltage sensor 17, a first current sensor 18, and a capacitor 26 for smoothing are provided. The first voltage sensor 17 detects a first DC input voltage detection value Vg.1 (DC input voltage value) of DC power outputted from the first array 2 and then inputted to the first step-up circuit 10, and outputs the first DC input voltage detection value Vg.1 to the control unit 12. The first current sensor 18 detects a first step-up circuit current detection value Iin.1 of current flowing in the DC reactor 15, and outputs the first step-up circuit current detection value Iin.1 to the control unit 12.

The second step-up circuit 41 to which the second array 40 is connected includes a DC reactor 42, a diode 43, and a switching element Qb2 composed of an IGBT or the like, to form a step-up chopper circuit as in the first step-up circuit.

On an input side of the second step-up circuit 41, a second voltage sensor 44, a second current sensor 45, and a capacitor 46 for smoothing are provided. The second voltage sensor 44 detects a second DC input voltage detection value Vg.2 of DC power outputted from the second array 40 and then inputted to the second step-up circuit 41, and outputs the second DC input voltage detection value Vg.2 to the control unit 12. The second current sensor 45 detects a second step-up circuit current detection value Iin.2 of current flowing in the DC reactor 42, and outputs the second step-up circuit current detection value Iin.2 to the control unit 12.

The control unit 12 has a function of calculating input powers Pin.1 and Pin.2 from the DC input voltage detection values Vg.1 and Vg.2 and the step-up circuit current detection values Iin.1 and Iin.2 and performing maximum power point tracking (MPPT) control for the first array 2 and the second array 40.

A capacitor 19 for smoothing is connected between the step-up circuits 10 and 41 and the inverter circuit 11.

The inverter circuit 11 includes switching elements Q1 to Q4 each composed of a Field Effect Transistor (FET). The switching elements Q1 to Q4 form a full-bridge circuit.

The switching elements Q1 to Q4 are connected to the control unit 12, and can be controlled by the control unit 12. The control unit 12 performs PWM control of operations of the switching elements Q1 to Q4. Thereby, the inverter circuit 11 converts power given from each of the step-up circuits 10 and 41 to AC power.

The inverter device 1 includes a filter circuit 21 between the inverter circuit 11 and the commercial power system 3.

The filter circuit 21 is composed of two AC reactors 22 and a capacitor 23. The filter circuit 21 has a function to remove a high-frequency component contained in AC power outputted from the inverter circuit 11. The AC power from which the high-frequency component has been removed by the filter circuit 21 is given to the commercial power system 3.

A third current sensor 24 for detecting an inverter current detection value Iinv (current flowing in the AC reactor 22) which is a current value of output of the inverter circuit 11 is connected to the filter circuit 21. A third voltage sensor 25 for detecting a voltage value (system voltage detection value Va) on the commercial power system 3 side is connected between the filter circuit 21 and the commercial power system 3.

The third current sensor 24 and the third voltage sensor 25 respectively output the detected inverter current detection value Iinv and the detected system voltage detection value Va to the control unit 12.

The control unit 12 controls the step-up circuits 10 and 41 and the inverter circuit 11 based on the system voltage detection value Va, the inverter current detection value Iinv, the DC input voltage detection values Vg.1 and Vg.2, and the step-up circuit current detection values Iin.1 and Iin.2.

[2 Control Unit]

Figure 3:
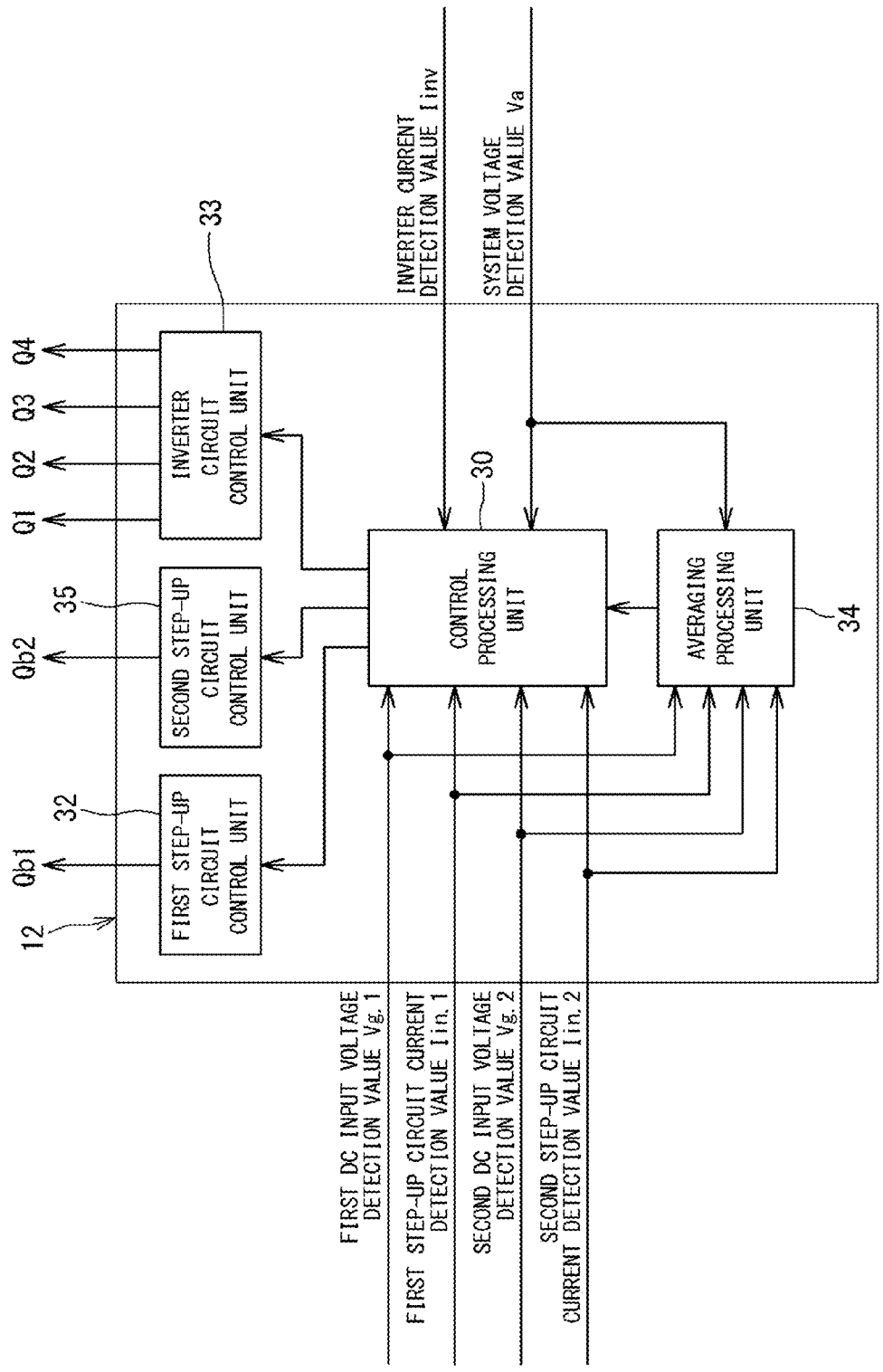
FIG. 3 is a block diagram of a control unit.

FIG. 3 is a block diagram of the control unit 12. As shown in FIG. 3, the control unit 12 functionally has a control processing unit 30, a first step-up circuit control unit 32, an inverter circuit control unit 33, an averaging processing unit 34, and a second step-up circuit control unit 35.

Some or all of the functions of the control unit 12 may be configured as a hardware circuit, or may be realized by software (computer program) executed by a computer. Such software (computer program) for realizing a function of the control unit 12 is stored in a storage device (not shown) of the computer.

The first step-up circuit control unit 32 controls the switching element Qb1 of the first step-up circuit 10 based on a target value and a detection value given from the control processing unit 30, thereby causing the first step-up circuit 10 to output power having current corresponding to the target value.

The second step-up circuit control unit 35 controls the switching element Qb2 of the second step-up circuit 41 based on a target value and a detection value given from the control processing unit 30, thereby causing the second step-up circuit 41 to output power having current corresponding to the target value.

The inverter circuit control unit 33 controls the switching elements Q1 to Q4 of the inverter circuit 11 based on a target value and a detection value given from the control processing unit 30, thereby causing the inverter circuit 11 to output power having current corresponding to the target value.

The control processing unit 30 receives the DC input voltage detection values Vg.1 and Vg.2, the step-up circuit current detection values Iin.1 and Iin.2, the system voltage detection value Va, and the inverter current detection value Iinv.

The control processing unit 30 calculates the first input power Pin.1 of the first step-up circuit 10 and an average value <Pin.1> thereof, and the second input power Pin.2 of the second step-up circuit 41 and an average value <Pin.2> thereof, from the DC input voltage detection values Vg.1 and Vg.2 and the step-up circuit current detection values Iin.1 and Iin.2.

The control processing unit 30 has a function to set a first DC input current target value Ig.1* (which will be described later) of the first step-up circuit 10 based on the first input power average value <Pin.1>, and to perform MPPT control for the first array 2 and perform feedback control for the first step-up circuit 10 and the inverter circuit 11.

The control processing unit 30 also has a function to set a DC input current target value Ig.2* (which will be described later) of the second step-up circuit 41 based on the second input power average value <Pin.2>, and to perform MPPT control for the second array 40 and perform feedback control for the first step-up circuit 10.

The DC input voltage detection values Vg.1 and Vg.2 and the step-up circuit current detection values Iin.1 and Iin.2 are given to the averaging processing unit 34 and the control processing unit 30.

The averaging processing unit 34 has a function to sample, at predetermined time intervals, the DC input voltage detection values Vg.1 and Vg.2 and the step-up circuit current detection values Iin.1 and Iin.2 given from both voltage sensors 17 and 44 and both current sensors 18 and 45, calculate their respective average values, and give the averaged DC input voltage detection values Vg.1 and Vg.2 and the averaged step-up circuit current detection values Iin.1 and Iin.2 to the control processing unit 30.

Figure 4:
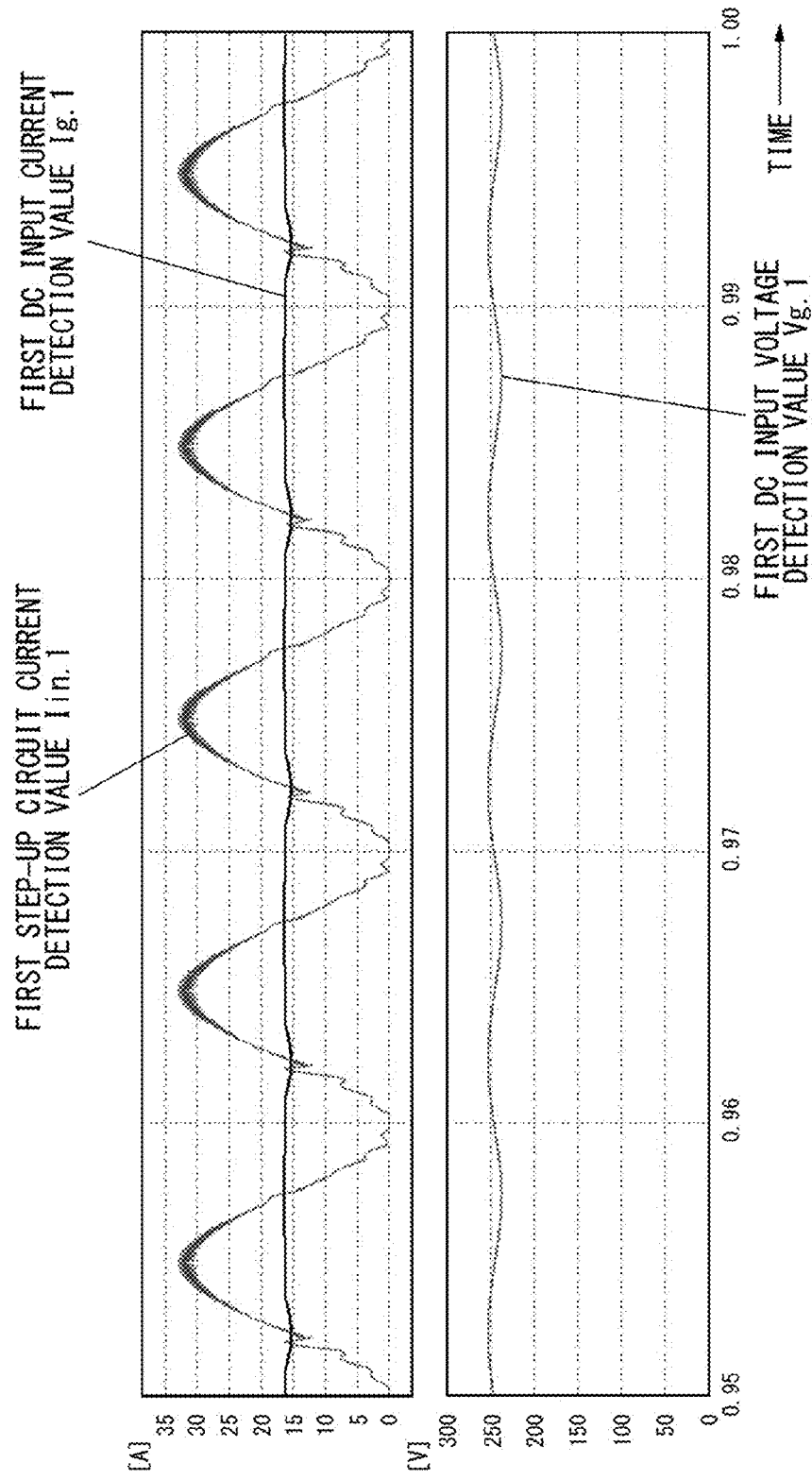
FIG. 4 is a graph showing an example of a simulation result of temporal variations in a first DC input voltage detection value Vg.1, a first step-up circuit current detection value Iin.1, and a first DC input current detection value Ig.1.

FIG. 4 is a graph showing an example of a simulation result of temporal variations in the first DC input voltage detection value Vg.1 and the first step-up circuit current detection value Iin.1.

The first step-up circuit current detection value Iin.1 appears as a waveform synchronized with the system voltage, based on a target value, as described later.

The first DC input current detection value Ig.1 is a current value detected on an input side relative to the capacitor 26.

As shown in FIG. 4, it is found that the first DC input voltage detection value Vg.1, the first DC input current detection value Ig.1, the first step-up circuit current detection value Iin.1 vary in a half cycle of the system voltage.

The reason why the first DC input voltage detection value Vg.1 and the first DC input current detection value Ig.1 vary periodically as shown in FIG. 4 is as follows. That is, the first step-up circuit current detection value Iin.1 of the inverter device 1 greatly varies between almost 0A and a peak value in a half cycle of the AC cycle in accordance with operations of the first step-up circuit 10 and the inverter circuit 11. Therefore, the variation component cannot be fully removed by the capacitor 26, and the first DC input current detection value Ig.1 is detected as pulsating current containing a component that varies in a half cycle of the AC cycle. On the other hand, output voltage of the photovoltaic panel varies depending on output current.

Therefore, the cycle of the periodic variation occurring in the first DC input voltage detection value Vg.1 is half the cycle of AC power outputted from the inverter device 1. That is, the cycle of the periodic variation is half the cycle of the commercial power system 3.

The averaging processing unit 34 averages the first DC input voltage detection value Vg.1 and the first step-up circuit current detection value Iin.1 in order to suppress an influence of the above periodic variations.

Figure 5:
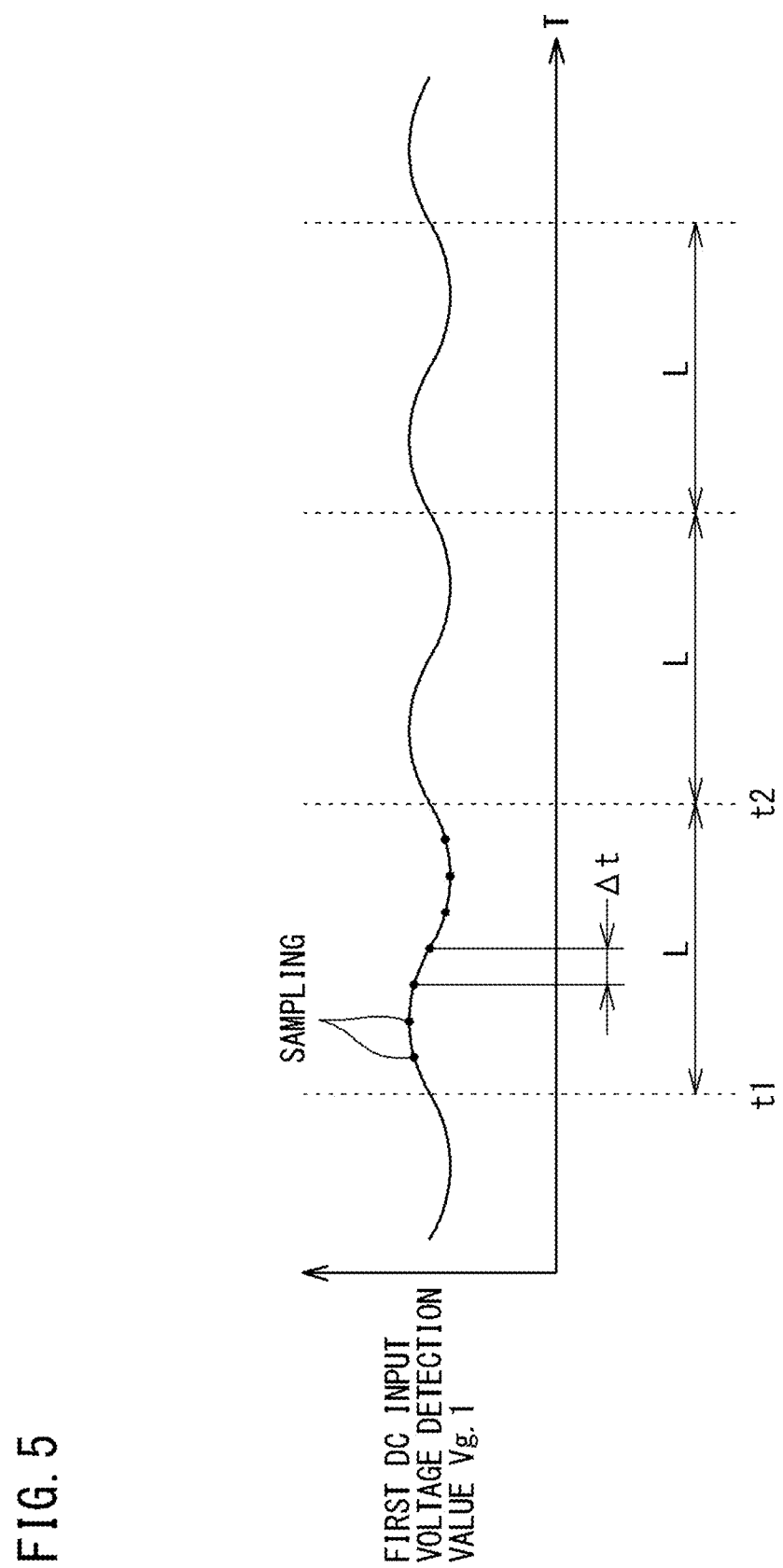
FIG. 5 is a diagram showing a manner in which an averaging processing unit averages the first DC input voltage detection value Vg.1.

FIG. 5 is a diagram showing a manner in which the averaging processing unit 34 averages the first DC input voltage detection value Vg.1.

The averaging processing unit 34 samples the given first DC input voltage detection value Vg.1 a plurality of times (at timings indicated by solid dots in FIG. 5) at predetermined time intervals $\Delta t$ during a period L from a timing t1 to a timing t2, and calculates an average value of the plurality of first DC input voltage detection values Vg.1 that have been obtained.

Here, the averaging processing unit 34 sets the period L to half the length of the cycle of the commercial power system 3. In addition, the averaging processing unit 34 sets the time interval $\Delta t$ to be sufficiently shorter than half the length of the cycle of the commercial power system 3.

Thus, the averaging processing unit 34 can accurately obtain the average value of the first DC input voltage detection value Vg.1 which periodically varies in a half cycle of the commercial power system 3, using as short a sampling period as possible.

The time interval $\Delta t$ of sampling may be set at, for example, 1/100 to 1/1000 of the cycle of the commercial power system 3, or 20 microseconds to 200 microseconds.

The averaging processing unit 34 may store the period L in advance, or may acquire the system voltage detection value Va from the third voltage sensor 25 and acquire information about the cycle of the commercial power system 3.

Here, the period L is set to half the length of the cycle of the commercial power system 3. The average value of the first DC input voltage detection value Vg.1 can be accurately calculated at least if the period L is set to half the cycle of the commercial power system 3. This is because the first DC input voltage detection value Vg.1 periodically varies in a half cycle of the commercial power system 3 in accordance with operations of the first step-up circuit 10 and the inverter circuit 11 as described above.

Therefore, if it is required to set the period L to be longer, the period L may be set to an integer multiple of a half cycle of the commercial power system 3, e.g., three or four times of a half cycle of the commercial power system 3. Thus, the voltage variation can be grasped on a cycle basis.

As described above, the first step-up circuit current detection value Iin.1 also periodically varies in a half cycle of the commercial power system 3, as in the first DC input voltage detection value Vg.1.

Therefore, the averaging processing unit 34 also calculates an average value of the first step-up circuit current detection value Iin.1 by the same method as in the first DC input voltage detection value Vg.1 shown in FIG. 5.

Further, the second DC input voltage detection value Vg.2 and the second step-up circuit current detection value Iin.2 on the second array 40 side also periodically vary in a half cycle of the commercial power system 3, for the same reason as for the first DC input voltage detection value Vg.1.

Therefore, the averaging processing unit 34 also calculates average values of the second DC input voltage detection value Vg.2 and the second step-up circuit current detection value Iin.2 by the same method as for the first DC input voltage detection value Vg.1 shown in FIG. 5.

The control processing unit 30 sequentially calculates average values of the DC input voltage detection values Vg.1 and Vg.2 and average values of the step-up circuit current detection values Iin.1 and Iin.2 per the period L.

The averaging processing unit 34 gives the calculated average values of the DC input voltage detection values Vg.1 and Vg.2 and the calculated average values of the step-up circuit current detection values Iin.1 and Iin.2 to the control processing unit 30.

In the present embodiment, as described above, the averaging processing unit 34 calculates average values of the DC input voltage detection values Vg.1 and Vg.2 and average values of the step-up circuit current detection values Iin.1 and Iin.2, and using these values, the control processing unit 30 controls both step-up circuits 10 and 41 and the inverter circuit 11 while performing MPPT control for both arrays 2 and 40. Therefore, even if DC currents from the both arrays 2 and 40 vary to be unstable, the control unit 12 can accurately obtain outputs of both arrays 2 and 40 as the average values of the DC input voltage detection values Vg.1 and Vg.2 and the average values of the step-up circuit current detection values Iin.1 and Iin.2. As a result, it becomes possible to appropriately perform MPPT control and effectively suppress reduction in power supply efficiency.

As described above, in a case where voltages (DC input voltage detection values Vg.1 and Vg.2) or currents (step-up circuit current detection values Iin.1 and Iin.2) of DC powers outputted from both arrays 2 and 40 vary due to variation in input current to the inverter device 1, the cycle of the variation coincides with a half cycle (a half cycle of the commercial power system 3) of AC power outputted from the inverter circuit 11.

In this regard, in the present embodiment, the DC input voltage detection values Vg.1 and Vg.2 and the step-up circuit current detection values Iin.1 and Iin.2 are each sampled a plurality of times at the time intervals Δt which are sufficiently shorter than a half cycle of the AC system, during the period L which is set to half the length of the cycle of the commercial power system 3, and the average values of the DC input voltage detection values Vg.1 and Vg.2 and the average values of the step-up circuit current detection values Iin.1 and Iin.2 are calculated from a result of the sampling. Therefore, even if voltage and current of the DC current vary periodically, the DC input voltage detection values Vg.1 and Vg.2 and the step-up circuit current detection values Iin.1 and Iin.2 can be accurately calculated.

Such variations occurring in the DC input voltage detection values Vg.1 and Vg.2 and the step-up circuit current detection values Iin.1 and Iin.2 given from both arrays 2 and 40 are due to variation in impedance of the inverter circuit 11 or the like as described above. Therefore, the DC input voltage detection values Vg.1 and Vg.2 and the step-up circuit current detection values Iin.1 and Iin.2 may be obtained from a result of sampling performed a plurality of times at time intervals Δt which are shorter than a half cycle of AC power outputted from the inverter circuit 11.

The control processing unit 30 sets the DC input current target values Ig.1* and Ig.2* based on the above input power average values <Pin.1> and <Pin.2>, and calculates target values for both step-up circuits 10 and 41 and the inverter circuit 11 based on the set DC input current target values Ig.1* and Ig.2* and the above values.

The control processing unit 30 has a function of giving the calculated target values to the first step-up circuit control unit 32, the second step-up circuit control unit 35, and the inverter circuit control unit 33 and performing feedback control for both step-up circuits 10 and 41 and the inverter circuit 11.

Figure 6:
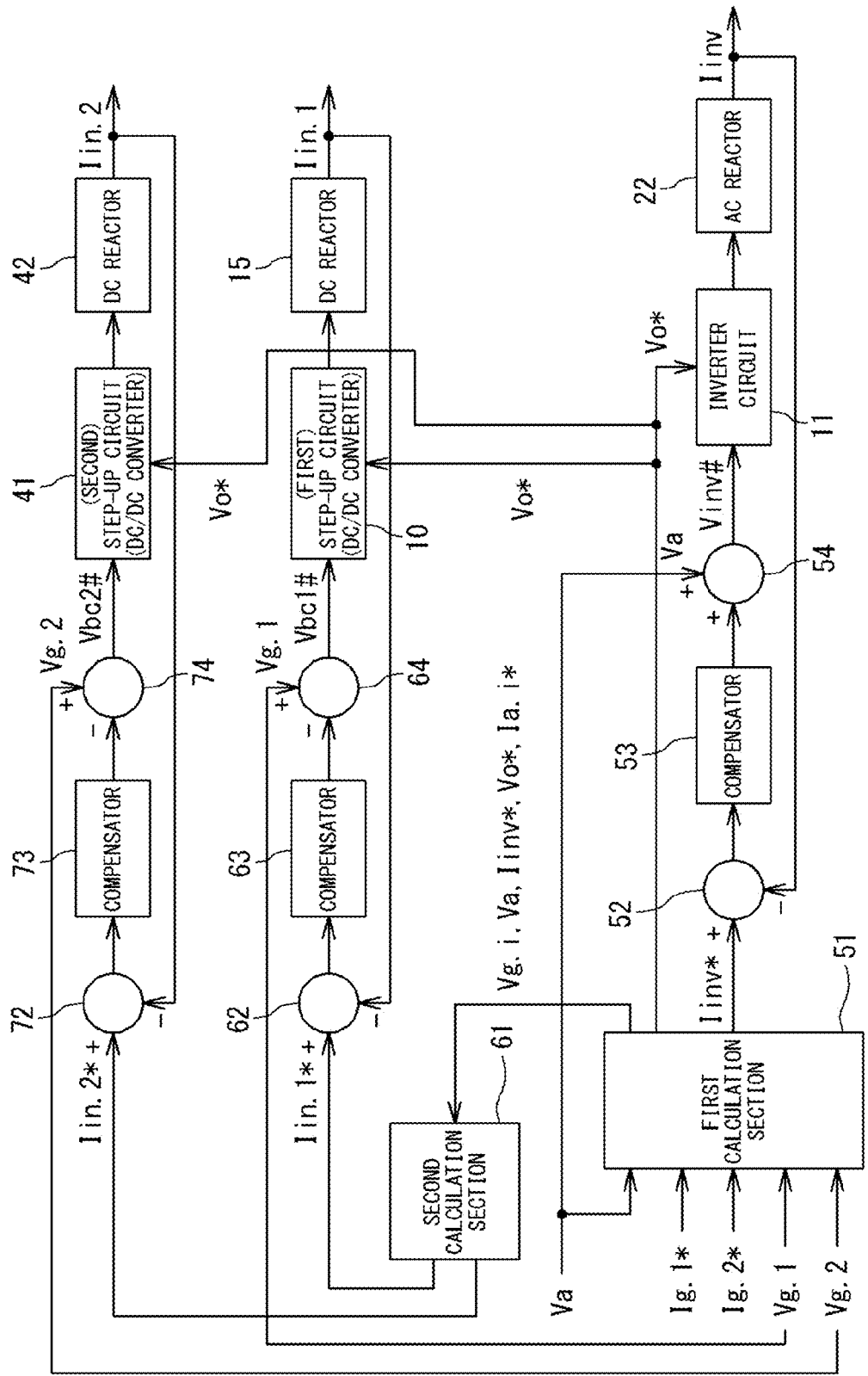
FIG. 6 is a control block diagram for explaining a control process by a control processing unit.

FIG. 6 is a control block diagram for explaining a control process by the control processing unit 30.

The control processing unit 30 includes, as function sections for controlling the inverter circuit 11, a first calculation section 51, a first adder 52, a compensator 53, and a second adder 54.

In addition, the control processing unit 30 includes, as function sections for controlling both step-up circuits 10 and 41, a second calculation section 61, a third adder 62, a compensator 63, a fourth adder 64, a fifth adder 72, a compensator 73, and a sixth adder 74.

Figure 7:
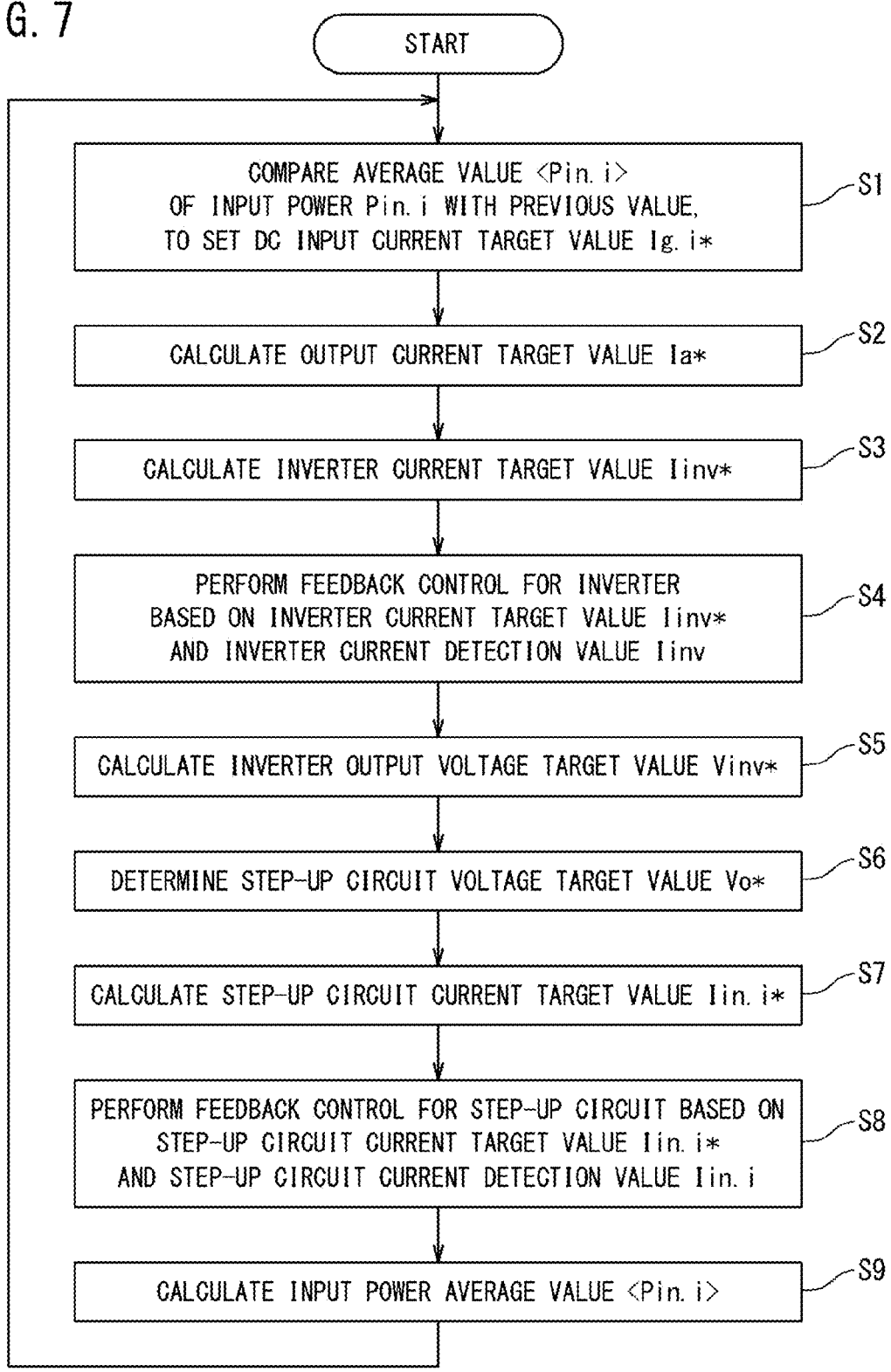
FIG. 7 is a flowchart showing a control process for both step-up circuits and an inverter circuit.

FIG. 7 is a flowchart showing a control process for both step-up circuits 10 and 41 and the inverter circuit 11. The function sections shown in FIG. 6 control both step-up circuits 10 and 41 and the inverter circuit 11 by executing the process shown in the flowchart in FIG. 7.

Hereinafter, the control process for both step-up circuits 10 and 41 and the inverter circuit 11 will be described with reference to FIG. 7.

First, the control processing unit 30 calculates the present input power average value <Pin.i> (step S9), and compares the present input power average value <Pin.i> with the input power average value <Pin.i> that has been previously calculated, to set a DC input current target value Ig.i* (step S1). The input power average value <Pin.i> is calculated based on the following expression (1).

$$\text{Input power average value} <Pin.i> = <Iin.i \times Vg.i> \quad (1)$$

In expression (1), "i" is a number corresponding to each step-up circuit connected to the inverter circuit 11, and is, in the present embodiment, "1" or "2". A case of "i=1" corresponds to the first step-up circuit 10, and a case of "i=2" corresponds to the second step-up circuit 41. Therefore, <Pin.1> indicates an input power average value of the first step-up circuit 10, and <Pin.2> indicates an input power average value of the second step-up circuit 41.

In the present embodiment, the control processing unit 30 calculates the input power average values <Pin.1> and <Pin.2>, and sets the DC input current target values Ig.1* and Ig.2*.

In expression (1), Iin.i is the step-up circuit current detection value, and Vg.i is the DC input voltage detection value, and the step-up circuit current detection value Iin.i and the DC input voltage detection value Vg.i are values averaged by the averaging processing unit 34.

In each expression other than expression (1) and relevant to the control shown below, instantaneous values which are not averaged are used for the step-up circuit current detection value Iin.i and the DC input voltage detection value Vg.i.

That is, the average value of the step-up circuit current detection value Iin.i and the average value of the DC input voltage detection value Vg.i are used for calculating the input power average value <Pin.i>.

A notation "< >" indicates an average value or an effective value of a value in the brackets. The same applies hereinafter.

The control processing unit 30 gives the set DC input current target value Ig.i* to the first calculation section 51.

As well as the DC input current target value Ig.i*, the DC input voltage detection value Vg.i and the system voltage detection value Va are given to the first calculation section 51.

The first calculation section 51 calculates an effective value <Ia*.i> of an output current target value for the inverter device 1 to output current to the system using each DC power supply as a source, based on the following expression (2) using the DC input current target value Ig.i*, the DC input voltage detection value Vg.i, a conversion efficiency ηi, and the system voltage detection value Va which are given thereto.

$$\text{Effective value } <Ia.i^*> \text{ of output current target value from each DC power supply} = <Ig.i^* \times Vg.i> \times \eta i / <Va> \quad (2)$$

Further, the first calculation section 51 calculates an output current target value Ia* based on the following expression (3) (step S2).

Here, the first calculation section 51 calculates each output current target value Ia.i* as a sine wave having the same phase as the system voltage detection value Va.

$$\text{Each output current target value } Ia.i^* = (\sqrt{2}) \times <Ia.i^*> \times \sin \omega t \quad (3)$$

Next, the first calculation section 51 calculates an inverter current target value Iinv* which is a current target value for controlling the inverter circuit 11, as shown by the following expression (4) (step S3).

$$\text{Each inverter current target value } Iinv^* = \Sigma Ia.i^* + sCaVa \quad (4)$$

In expression (4), Ca is a capacitance of the capacitor 23, and s is the Laplace operator.

The above expression (4) is represented as follows, using a derivative with respect to time t.

$$Iinv^* = \Sigma Ia.i^* + Ca \times (dVa/dt) \quad (4a)$$

In expressions (4) and (4a), the second term on the right-hand side is a value added in consideration of current flowing through the capacitor 23 of the filter circuit 21.

The output current target value Ia* is calculated as a sine wave having the same phase as the system voltage detection value Va, as shown by the above expression (3). That is, the control processing unit 30 controls the inverter circuit 11 so that a current phase of AC power outputted from the inverter device 1 is the same as a phase of the system voltage (system voltage detection value Va).

After calculating the inverter current target value Iinv*, the first calculation section 51 gives the inverter current target value Iinv* to the first adder 52.

The inverter circuit 11 is subjected to feedback control based on the inverter current target value Iinv*.

As well as the inverter current target value Iinv*, the present inverter current detection value Iinv is given to the first adder 52.

The first adder 52 calculates a difference between the inverter current target value Iinv* and the present inverter current detection value Iinv, and gives a result of the calculation to the compensator 53.

When the difference is given, the compensator 53 performs calculation based on a proportionality coefficient or the like, and then the second adder 54 adds the calculation result and the system voltage Va, thereby calculating an inverter voltage reference value Vinv# that allows the difference to converge so that the inverter current detection value Iinv becomes the inverter current target value Iinv*. A control signal obtained by comparing the inverter voltage reference value Vinv# with the output voltage target value Vo* for the DC/DC converter given from the first calculation section 51 is given to the inverter circuit control unit 33, thereby causing the inverter circuit 11 to output voltage according to the inverter output voltage target value Vinv*.

The voltage outputted from the inverter circuit 11 is given to the AC reactor 22, and then fed back as a new inverter current detection value Iinv. Then, a difference between the inverter current target value Iinv* and the inverter current detection value Iinv is calculated again by the first adder 52, and the inverter circuit 11 is controlled based on the difference as described above.

As described above, the inverter circuit 11 is subjected to feedback control based on the inverter current target value Iinv* and the inverter current detection value Iinv (step S4).

On the other hand, the inverter current target value Iinv* calculated by the first calculation section 51, as well as the DC input voltage detection value Vg.i and the system voltage detection value Va, is given to the second calculation section 61.

The second calculation section 61 calculates the inverter output voltage target value Vinv* based on the following expression (5) (step S5).

$$\text{Inverter output voltage target value } Vinv^* = Va + ZaIinv^* \quad (5)$$

In expression (5), Za is an impedance of the AC reactor.

In expression (5), the second term on the right-hand side is a value added in consideration of voltage generated between both ends of the AC reactor 22.

In the present embodiment, the inverter output voltage target value Vinv* (voltage target value) is set based on the inverter current target value Iinv* which is the current target value for controlling the inverter circuit 11 so that current of AC power outputted from the inverter device 1 has the same phase as the system voltage detection value Va.

After calculating the inverter output voltage target value Vinv*, the second calculation section 61 compares the voltage Vg or preferably the following DC voltage Vgf, as voltage $V_{DC}$.i based on the solar battery array 2, 40 which is the DC power supply, with an absolute value of the inverter output voltage target value Vinv*, and determines the greater one to be the step-up circuit voltage target value Vo* as shown by the following expression (6) (step S6). The DC voltage Vgf is voltage calculated by considering voltage drop due to an impedance Z of the DC reactor 15 for Vg, and in a case where the step-up circuit current target value is denoted by Iin.i*, Vgf is represented as Vgf=(Vg−ZIin.i*). Accordingly, Vo* can be represented as follows.

$$Vo^* = \text{Max}(Vg - ZIin.i^*, \text{ absolute value of } Vinv^*) \quad (6)$$

For Vg, as shown by the following expression (7), the greatest one of the voltage values of the step-up circuits 10 and 41 is employed.

$$Vg = \text{Max}(Vg.i) \quad (7)$$

Further, the second calculation section 61 calculates a step-up circuit current target value Iin* based on the following expression (8) (step S7).

$$\text{Step-up circuit current target value } Iin.i^* = [Ia.i^* \times Vinv^* + Ki\{(sCaVa)Vinv^* + (sCoVo^*) \times Vo^*\}]/(Vg.i - ZIin.i) \quad (8)$$

Here, Ki is a given constant that satisfies the following.

$$\sum_i Ki = 1$$

In expression (8), Co is a capacitance of the capacitor 19 (smoothing capacitor), and s is the Laplace operator.

The above expression (8) is represented as follows, using a derivative with respect to time t.

$$Iin.i^* = [Ia.i^* \times Vinv^* + Ki\{(Ca \times dVa/dt)Vinv^* + (Co \times dVo^*/dt) \times Vo^*\}]/(Vg.i - ZIin.i) \quad (8a)$$

If current flowing through the capacitor 19 is detected and the detected current is denoted by Ico, the following expression is obtained.

$$Iin.i^* = [Ia.i^* \times Vinv^* + Ki\{(Ca \times dVa/dt)Vinv^* + Ico \times Vo^*\}]/(Vg.i - ZIin.i) \quad (8b)$$

In expressions (8), (8a), and (8b), the third term is a value added in consideration of reactive power passing through the capacitor 19. That is, consideration of the reactive power in addition to the power target value for the inverter circuit 11 allows for more accurate calculation of the value of Iin.i*.

Further, if power loss $P_{LOSS}$.i of the inverter device 1 is measured in advance, the above expression (8a) can be represented as follows.

$$Iin.i^* = [Ia.i^* \times Vinv^* + Ki\{(Ca \times dVa/dt)Vinv^* + (C \times dVo^*/dt) \times Vo^*\} + P_{LOSS}.i]/(Vg.i - ZIin.i) \quad (8c)$$

Similarly, the above expression (8b) can be represented as follows.

$$Iin.i^* = [Ia.i^* \times Vinv^* + Ki\{(Ca \times dVa/dt)Vinv^* + Ico \times Vo^*\} + P_{LOSS}.i]/(Vg.i - ZIin.i) \quad (8d)$$

In this case, consideration of the reactive power and the power loss $P_{LOSS}.i$ in addition to the power target value of the inverter circuit 11 allows for more strict calculation of the value of Iin.i*.

The second calculation section 61 calculates the step-up circuit current target value Iin.i* (step-up circuit current target values Iin.1* and Iin.2*) as described above. The second calculation section 61 gives the step-up circuit current target value Iin.1* to the third adder 62.

The first step-up circuit 10 is subjected to feedback control based on the step-up circuit current target value Iin.1*.

As well as the step-up circuit current target value Iin.1*, the present first step-up circuit current detection value Iin.1 is given to the third adder 62.

The third adder 62 calculates a difference between the step-up circuit current target value Iin.1* and the present first step-up circuit current detection value Iin.1, and gives a result of the calculation to the compensator 63.

When the difference is given, the compensator 63 performs calculation based on a proportionality coefficient or the like, and then the fourth adder 64 subtracts the calculation result from the DC input voltage detection value Vg.1, thereby calculating a first step-up circuit voltage reference value Vbc1# that allows the difference to converge so that the first step-up circuit current detection value Iin.1 becomes the step-up circuit current target value Iin.1*. A control signal obtained by comparing the first step-up circuit voltage reference value Vbc1# with the output voltage target value Vo* for the DC/DC converter given from the first calculation section 51 is given to the first step-up circuit control unit 32, thereby causing the first step-up circuit 10 to output voltage according to the step-up circuit voltage target value Vo*.

The power outputted from the first step-up circuit 10 is given to the DC reactor 15, and then fed back as a new first step-up circuit current detection value Iin.1. Then, a difference between the step-up circuit current target value Iin.1* and the first step-up circuit current detection value Iin.1 is calculated again by the third adder 62, and the first step-up circuit 10 is controlled based on the difference as described above.

As described above, the first step-up circuit 10 is subjected to feedback control based on the step-up circuit current target value Iin.1* and the first step-up circuit current detection value Iin.1 (step S8).

The second calculation section 61 gives the step-up circuit current target value Iin.2* to the fifth adder 72.

The second step-up circuit 41 is subjected to feedback control based on the step-up circuit current target value Iin.2*.

As well as the step-up circuit current target value Iin.2*, the present second step-up circuit current detection value Iin.2 is given to the fifth adder 72.

The fifth adder 72 calculates a difference between the step-up circuit current target value Iin.2* and the present second step-up circuit current detection value Iin.2, and gives a result of the calculation to the compensator 73.

When the difference is given, the compensator 73 performs calculation based on a proportionality coefficient or the like, and then the sixth adder 74 subtracts the calculation result from the DC input voltage detection value Vg.2, thereby calculating a second step-up circuit voltage reference value Vbc2# that allows the difference to converge so that the second step-up circuit current detection value Iin.2 becomes the step-up circuit current target value Iin.2*. A control signal obtained by comparing the second step-up circuit voltage reference value Vbc2# with the output voltage target value Vo* for the DC/DC converter given from the first calculation section 51 is given to the second step-up circuit control unit 35, thereby causing the second step-up circuit 41 to output voltage according to the step-up circuit voltage target value Vo*.

Thus, as in the first step-up circuit 10, the second step-up circuit 41 is subjected to feedback control based on the step-up circuit current target value Iin.2* and the second step-up circuit current detection value Iin.2 (step S8).

After the above step S8, the control processing unit 30 calculates the present input power average value <Pin.i> based on the above expression (1) (step S9).

Based on comparison with the input power average value <Pin.i> that has been previously calculated, the control processing unit 30 sets the DC input current target value Ig.i* so that the input power average value <Pin.i> becomes a maximum value (follows the maximum power point).

Thus, the control processing unit 30 controls both step-up circuits 10 and 41 and the inverter circuit 11 while performing MPPT control for the first array 2 and the second array.

Figure 8:
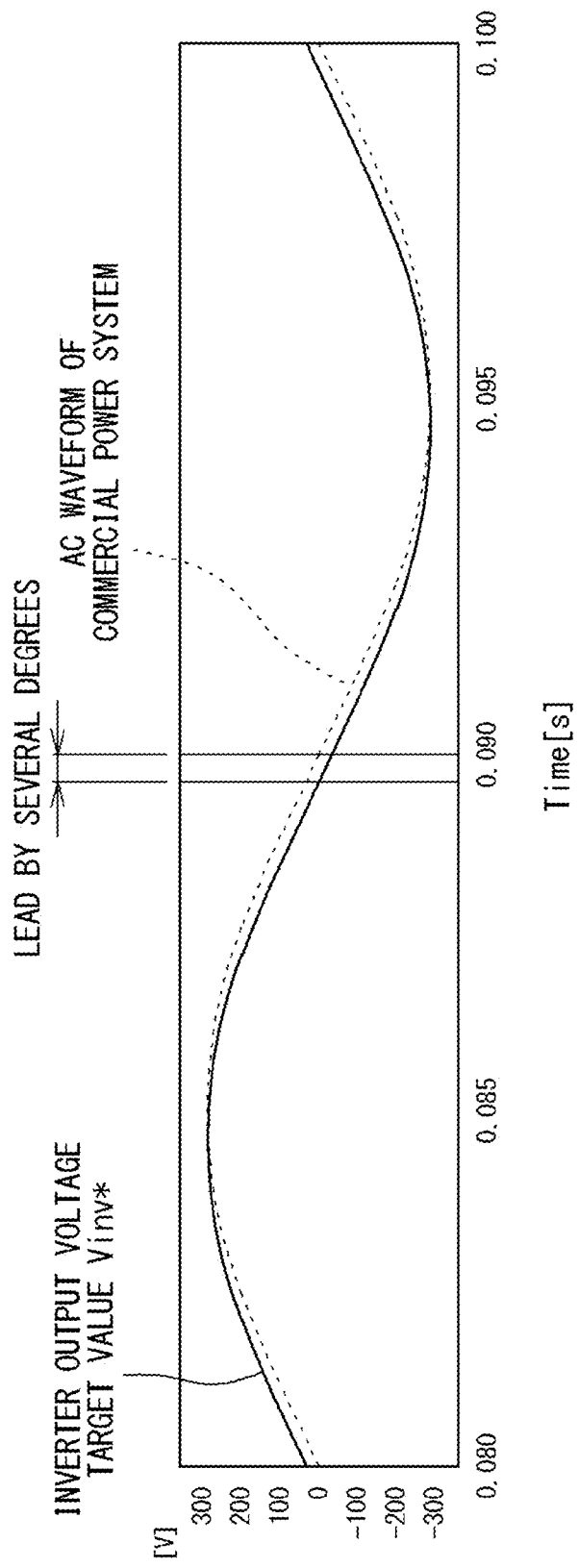
FIG. 8 is a diagram showing an example of an inverter output voltage target value Vinv*.

FIG. 8 is a diagram showing an example of the inverter output voltage target value Vinv*. In FIG. 8, the vertical axis indicates voltage and the horizontal axis indicates time. A broken line indicates a voltage waveform of the commercial power system 3, and a solid line indicates a waveform of the inverter output voltage target value Vinv*.

The inverter device 1 outputs power, using the inverter output voltage target value Vinv* shown in FIG. 8 as a voltage target value, through the control according to the flowchart in FIG. 7.

Figure 9:
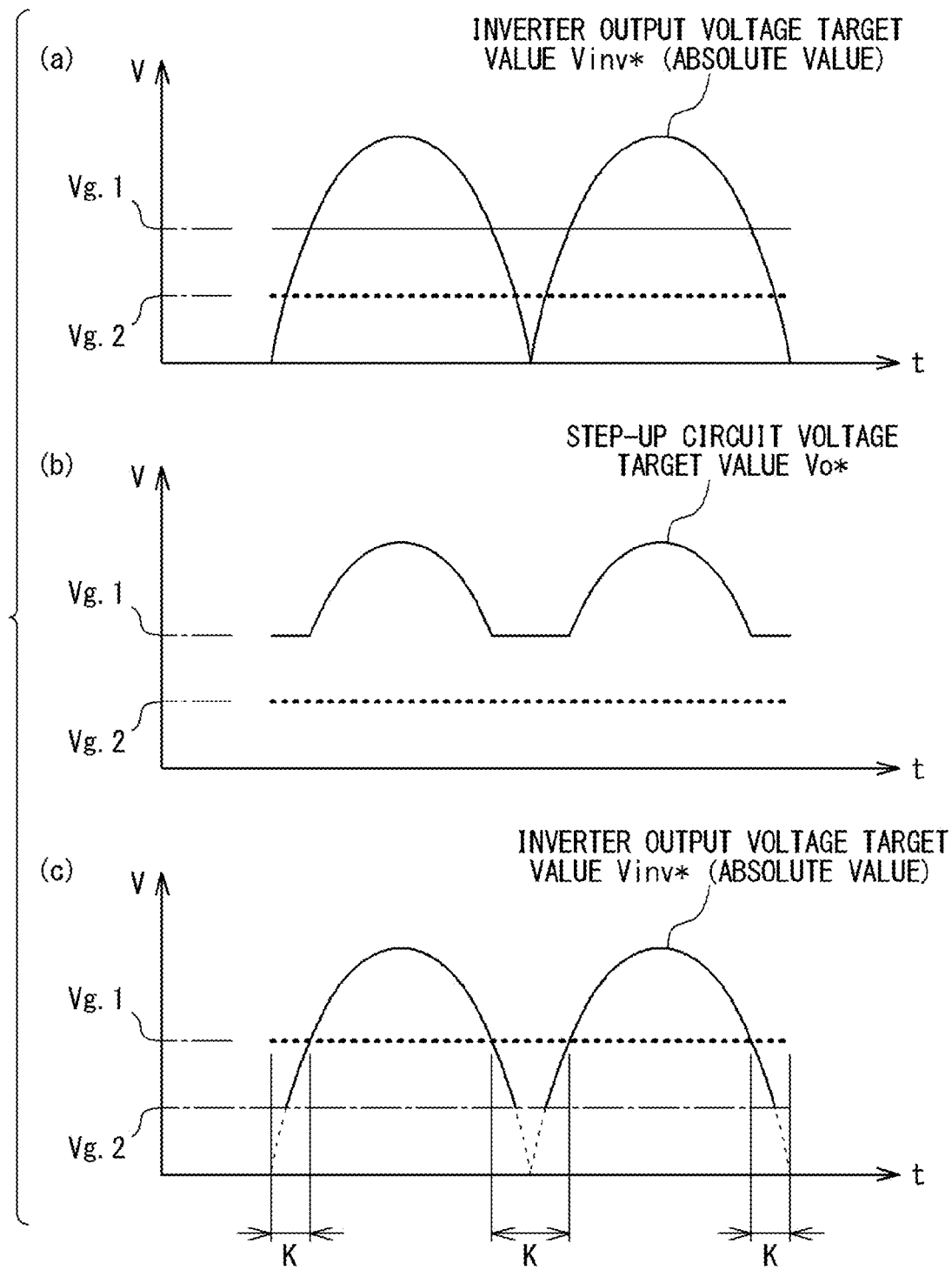
FIG. 9 is a schematic diagram showing how to calculate a step-up circuit voltage target value Vo*, in which (a) shows comparison between the inverter output voltage target value Vinv* and the first DC input voltage detection value Vg.1, (b) shows a waveform of the step-up circuit voltage target value Vo*, and (c) shows a case of stepping up voltage of power outputted from the second step-up circuit, using a second DC input voltage detection value Vg.2 as a reference.

Therefore, the inverter device 1 outputs power having voltage according to the waveform of the inverter output voltage target value Vinv* shown in FIG. 9.

As shown in FIG. 9, the two waveforms have almost the same voltage value and the same frequency, but the phase of the inverter output voltage target value Vinv* leads the phase of voltage of the commercial power system 3 by several degrees.

The control processing unit 30 of the present embodiment causes the phase of the inverter output voltage target value Vinv* to lead the phase of voltage of the commercial power system 3 by about three degrees while executing the feedback control for the first step-up circuit 10 and the inverter circuit 11, as described above.

The degree of angle by which the phase of the inverter output voltage target value Vinv* is caused to lead the phase of voltage of the commercial power system 3 may be several degrees, and as described later, the degree of angle is set within such a range that the phase of a voltage waveform of a difference from a voltage waveform of the commercial power system 3 leads the phase of the voltage waveform of the commercial power system 3 by 90 degrees. For example, the degree of the phase leading angle is set to be greater than 0 degrees and smaller than 10 degrees.

[3 Voltage Target Value for Step-up Circuit]

In the present embodiment, as described above, the second array 40 connected to the second step-up circuit 41 is configured to output power having smaller voltage than voltage of power outputted from the first array 2.

On the other hand, as shown by the above expressions (6) and (7) and step S6 in FIG. 7, the step-up circuit voltage target value Vo* which is a voltage target value for powers outputted from both step-up circuits 10 and 41 is set as follows.

That is, the first DC input voltage detection value Vg.1 of the first array 2 and the second DC input voltage detection value Vg.2 of the second array 40 are compared with each other, and the first DC input voltage detection value Vg.1 which is the higher voltage is selected (expression (7)).

Subsequently, the selected first DC input voltage detection value Vg.1 and an absolute value of the inverter output voltage target value Vinv* are compared with each other, and the higher value is employed, thus obtaining the step-up circuit voltage target value Vo*.

FIG. 9 is a schematic diagram showing how to calculate the step-up circuit voltage target value Vo*. In FIG. 9, (a) shows comparison between the inverter output voltage target value Vinv* and the first DC input voltage detection value Vg.1. In (a) of FIG. 9, the vertical axis indicates voltage and the horizontal axis indicates time.

The control processing unit 30 compares the first DC input voltage detection value Vg.1 and the absolute value of the inverter output voltage target value Vinv*, and employs the higher value. Therefore, a waveform of the step-up circuit voltage target value Vo* follows the inverter output voltage target value Vinv* during a period in which the absolute value of the inverter output voltage target value Vinv* is equal to or greater than the first DC input voltage detection value Vg.1, and follows the first DC input voltage detection value Vg.1 during a period in which the absolute value of the inverter output voltage target value Vinv* is equal to or smaller than the first DC input voltage detection value Vg.1.

In FIG. 9, (b) shows a waveform of the step-up circuit voltage target value Vo*. As shown in (b) of FIG. 9, the waveform of the step-up circuit voltage target value Vo* follows the absolute value of the inverter output voltage target value Vinv* during a period in which the inverter output voltage target value Vinv* is equal to or greater than the first DC input voltage detection value Vg.1, and follows the first DC input voltage detection value Vg.1 during a period in which the inverter output voltage target value Vinv* is equal to or smaller than the first DC input voltage detection value Vg.1.

Therefore, as shown in (b) of FIG. 9, since the minimum voltage value of the step-up circuit voltage target value Vo* is the first DC input voltage detection value Vg.1, the step-up circuit voltage target value Vo* always has greater voltage than the second DC input voltage detection value Vg.2, and is prevented from becoming lower than the first DC input voltage detection value Vg.1.

That is, the second step-up circuit 41 always performs step-up operation to output power having voltage according to the step-up circuit voltage target value Vo*.

For example, if power to be outputted from the second step-up circuit 41 is stepped up using the second DC input voltage detection value Vg.2 as a reference, power outputted from the second step-up circuit 41 has a lower voltage value than the first DC input voltage detection value Vg.1 in a range K in (c) of FIG. 9, and when power is supplied from only the first array 2, supply of power from the second array 40 is not obtained. Therefore, power supply efficiency of the arrays 2 and 40 might be reduced as a whole.

In this regard, in the present embodiment, as shown in (c) of FIG. 9, the second step-up circuit 41 is controlled so that a voltage value of power to be outputted from the second step-up circuit 41 substantially coincides with the first DC input voltage detection value Vg.1 in the range K in which the inverter output voltage target value Vinv* is equal to or smaller than the first DC input voltage detection value Vg.1. Therefore, the minimum voltage value of power outputted from the second step-up circuit 41 can be made to substantially coincide with the first DC input voltage detection value Vg.1.

Thus, the voltage value of power outputted from the second step-up circuit 41 can be prevented from becoming greatly lower than the voltage value of power outputted from the first step-up circuit 10. As a result, occurrence of the period K in which supply of power from the second array 40 through the second step-up circuit 41 is not obtained can be prevented, whereby reduction in power supply efficiency can be suppressed.

In the present embodiment, in order to calculate the step-up circuit current target value Iin.i* which is a current target value for each step-up circuit, as shown by the above expression (8), current target values for the respective step-up circuits 10 and 41 can be obtained appropriately. As a result, the minimum voltage value of power outputted from the second step-up circuit 41 substantially coincides with the first DC input voltage detection value Vg.1.

If the first step-up circuit 10 is controlled based on the step-up circuit current target value Iin.1*, the first step-up circuit 10 stops step-up operation during a period in which the inverter output voltage target value Vinv* is lower than the first DC input voltage detection value Vg.1, and performs step-up operation during a period in which the inverter output voltage target value Vinv* is higher than the first DC input voltage detection value Vg.1.

It is noted that a state in which a voltage value (second DC input voltage detection value Vg.2) of power outputted from the second step-up circuit 41 substantially coincides with the first DC input voltage detection value Vg.1 means a state in which these voltages coincide with each other to such a degree that, when powers are supplied from the first step-up circuit 10 and the second step-up circuit 41, the supply of powers can be obtained from both step-up circuits.

FIG. 10 is graphs showing a simulation result of temporal variations in the DC input voltage detection values Vg.1 and Vg.2 and the step-up circuit voltage target value Vo*, together with each target value.

In FIG. 10, an upper graph shows a relationship between the inverter output voltage target value Vinv* and the system voltage detection value Va, a middle graph shows a relationship between the DC input voltage values Vg.1 and Vg.2 and the step-up circuit voltage target value Vo*, and a lower graph shows the step-up circuit current target values Iin.1* and Iin.2*.

As shown in FIG. 10, it can be confirmed that a waveform of the step-up circuit voltage target value Vo* follows the absolute value of the inverter output voltage target value Vinv* during a period in which the inverter output voltage target value Vinv* is equal to or greater than the first DC input voltage detection value Vg.1, and follows the first DC input voltage detection value Vg.1 during a period in which the inverter output voltage target value Vinv* is equal to or smaller than the first DC input voltage detection value Vg.1.

[4 Control for First Step-up Circuit and Inverter Circuit]

The first step-up circuit control unit 32 (FIG. 3) controls the switching element Qb1 of the first step-up circuit 10. The inverter circuit control unit 33 controls the switching elements Q1 to Q4 of the inverter circuit 11.

The first step-up circuit control unit 32 and the inverter circuit control unit 33 respectively generate a first step-up circuit carrier wave and an inverter circuit carrier wave, and respectively modulate these carrier waves with the first step-up circuit voltage reference value Vbc1# and the inverter voltage reference value Vinv# which are target values given from the control processing unit 30, to generate drive waveforms for driving each switching element.

The first step-up circuit control unit 32 and the inverter circuit control unit 33 control each switching element based on the drive waveforms, thereby causing the first step-up circuit 10 and the inverter circuit 11 to output AC powers having voltage waveforms approximate to a waveform of the inverter output voltage target value Vinv*.

Figure 11:
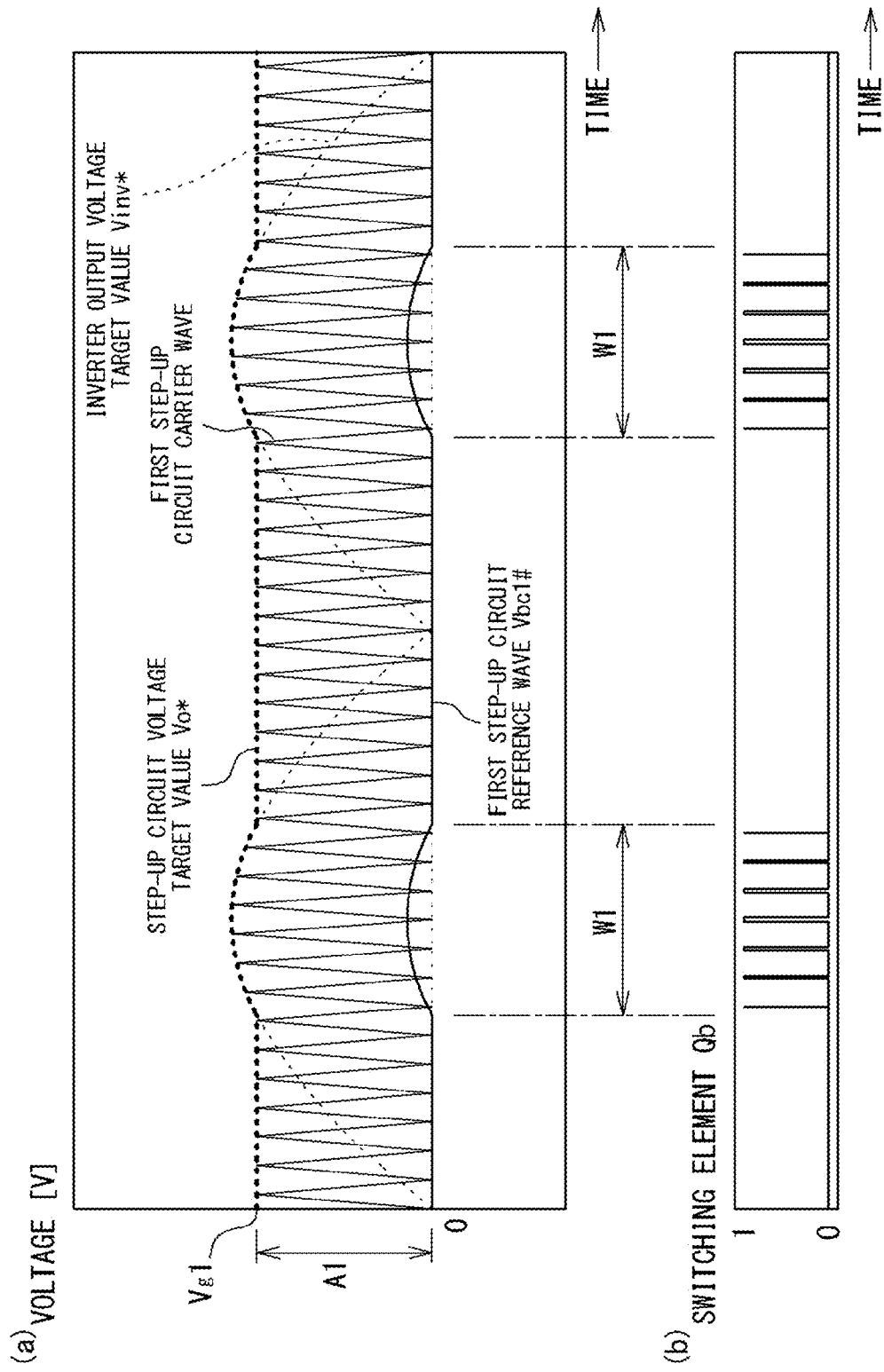
FIG. 11 is graphs in which (a) shows comparison between a first step-up circuit carrier wave and a waveform of a first step-up circuit voltage reference value Vbc1#, and (b) shows a drive waveform for driving a switching element, generated by a first step-up circuit control unit.

In FIG. 11, (a) is a graph showing comparison between the first step-up circuit carrier wave and a waveform of the first step-up circuit voltage reference value Vbc1#. In (a) of FIG. 11, the vertical axis indicates voltage and the horizontal axis indicates time. In (a) of FIG. 11, for facilitating the understanding, the wavelength of the first step-up circuit carrier wave is elongated as compared to the actual wavelength.

The step-up circuit carrier wave generated by the first step-up circuit control unit 32 is a triangle wave having a minimum value of "0", and has an amplitude A1 set at the step-up circuit voltage target value Vo* given from the control processing unit 30.

The frequency of the step-up circuit carrier wave is set by the step-up circuit control unit 32 in accordance with a control command from the control processing unit 30, so as to realize a predetermined duty ratio.

As described above, the step-up circuit voltage target value Vo* varies so as to follow an absolute value of the inverter output voltage target value Vinv* during a period W1 in which the absolute value of the inverter output voltage target value Vinv* is generally equal to or greater than the first DC input voltage detection value Vg.1, and follow the first DC input voltage detection value Vg.1 during the other period. Therefore, the amplitude A1 of the first step-up circuit carrier wave also varies in accordance with the step-up circuit voltage target value Vo*.

In the present embodiment, the first DC input voltage detection value Vg.1 is 250 volts, and the amplitude of voltage of the commercial power system 3 is 288 volts.

A waveform (hereinafter, may be referred to as a first step-up circuit reference wave Vbc1#) of the first step-up circuit voltage reference value Vbc1# corresponds to a value calculated based on the step-up circuit current target value Iin.1* by the control processing unit 30, and has a positive value during the period W1 in which the absolute value of the inverter output voltage target value Vinv* is greater than the first DC input voltage detection value Vg.1. During the period W1, the first step-up circuit reference wave Vbc1# has a waveform approximate to the shape of a waveform created by the step-up circuit voltage target value Vo*, and crosses the first step-up circuit carrier wave.

The first step-up circuit control unit 32 compares the first step-up circuit carrier wave with the first step-up circuit reference wave Vbc1#, and generates a drive waveform for driving the switching element Qb1 so as to be turned on during a period in which the first step-up circuit reference wave Vbc1# is equal to or greater than the first step-up circuit carrier wave, and to be turned off during a period in which the first step-up circuit reference wave Vbc1# is equal to or smaller than the carrier wave.

In FIG. 11, (b) shows the drive waveform for driving the switching element Qb1, generated by the first step-up circuit control unit 32. In (b) of FIG. 11, the vertical axis indicates voltage and the horizontal axis indicates time. The horizontal axis in (b) of FIG. 11 coincides with that in (a) of FIG. 11.

The drive waveform indicates switching operation of the switching element Qb1. When the drive waveform is given to the switching element Qb1, the switching element Qb1 is caused to perform switching operation in accordance with the drive waveform. The drive waveform forms a control command to turn off the switching element when the voltage is 0 volts and turn on the switching element when the voltage is a plus voltage.

The first step-up circuit control unit 32 generates the drive waveform so that the switching operation is performed during the range W1 in which the absolute value of the voltage value of the inverter output voltage target value Vinv* is equal to or greater than the first DC input voltage detection value Vg.1. Therefore, in a range in which the absolute value is equal to or smaller than the first DC input voltage detection value Vg.1, the switching element Qb1 is controlled to stop the switching operation.

Each pulse width is determined by an intercept of the first step-up circuit carrier wave which is a triangle wave. Therefore, the pulse width is greater at a part where voltage is higher.

As described above, the first step-up circuit control unit 32 modulates the first step-up circuit carrier wave with the first step-up circuit reference wave Vbc1#, to generate the drive waveform representing pulse widths for switching. The first step-up circuit control unit 32 performs PWM control for the switching element Qb1 of the first step-up circuit 10, based on the generated drive waveform.

In a case where a switching element Qbu that conducts current in a forward direction of the diode 16 is provided in parallel with the diode 16, a drive waveform inverted from the drive waveform for the switching element Qb is used for the switching element Qbu. In order to prevent the switching element Qb and the switching element Qbu from conducting currents at the same time, a dead time of about 1 microsecond is provided at a part where a drive pulse for the switching element Qbu shifts from OFF to ON.

Figure 12:
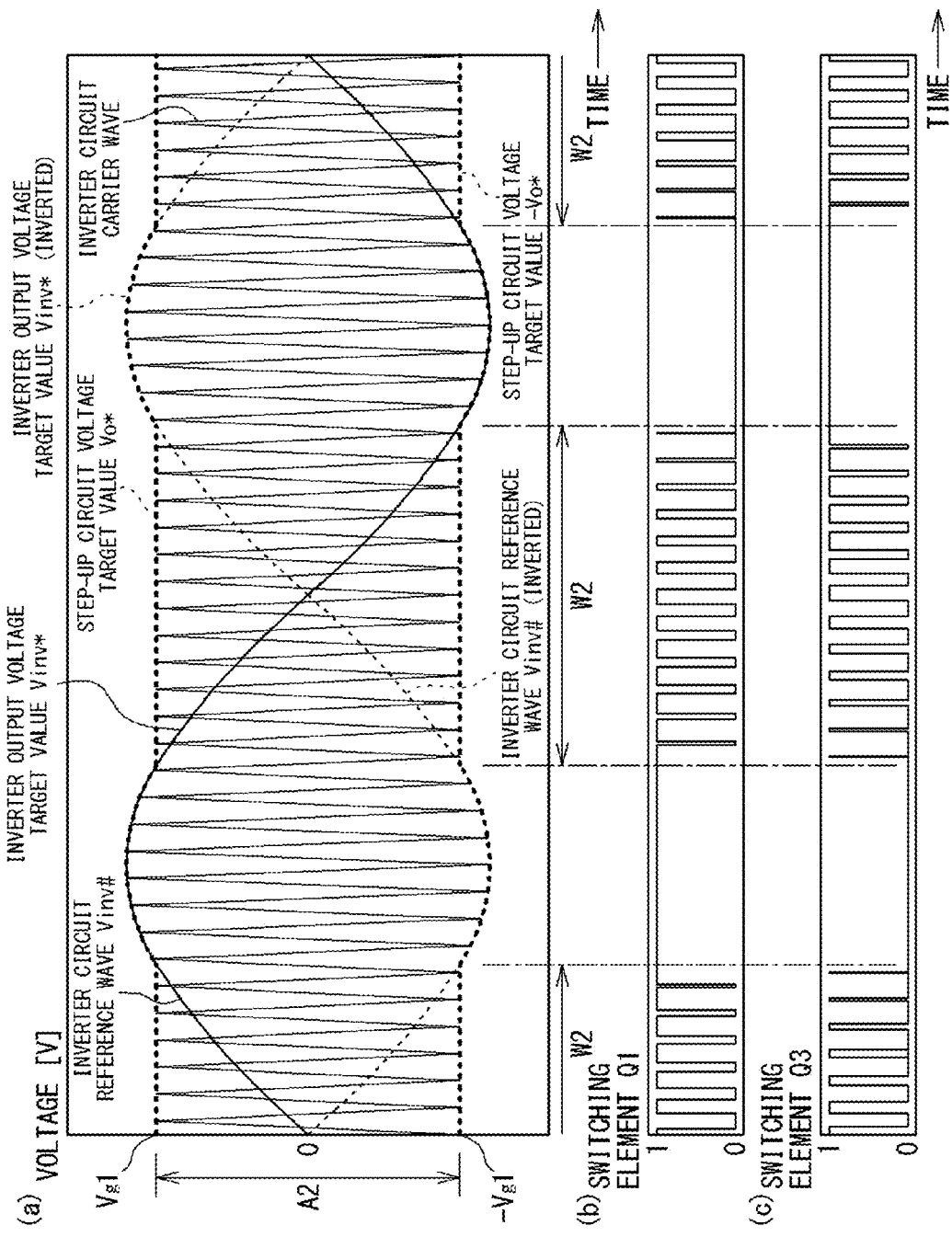
FIG. 12 is graphs in which (a) shows comparison between an inverter circuit carrier wave and a waveform of an inverter voltage reference value Vinv#, (b) shows a drive waveform for driving a switching element Q1, generated by an inverter circuit control unit, and (c) shows a drive waveform for driving a switching element Q3, generated by the inverter circuit control unit.

In FIG. 12, (a) is a graph showing comparison between the inverter circuit carrier wave and a waveform of the inverter voltage reference value Vinv#. In (a) of FIG. 12, the vertical axis indicates voltage and the horizontal axis indicates time. Also in (a) of FIG. 12, for facilitating the understanding, the wavelength of the inverter circuit carrier wave is elongated as compared to the actual wavelength.

The inverter circuit carrier wave generated by the inverter circuit control unit 33 is a triangle wave having an amplitude center at 0 volts, and a one-side amplitude thereof is set at the step-up circuit voltage target value Vo* (a voltage target value for the capacitor 23). Therefore, the inverter circuit carrier wave has a period in which an amplitude A2 thereof is twice (500 volts) as great as the first DC input voltage detection value Vg.1 and a period in which the amplitude A2 is twice (576 volts at maximum) as great as voltage of the commercial power system 3.

The frequency thereof is set by the inverter circuit control unit 33 in accordance with a control command from the control processing unit 30, or the like, so as to realize a predetermined duty ratio.

As described above, the step-up circuit voltage target value Vo* varies to follow an absolute value of the inverter output voltage target value Vinv* during the period W1 in which the absolute value of the inverter output voltage target value Vinv* is generally equal to or greater than the first DC input voltage detection value Vg.1, and follow the first DC input voltage detection value Vg.1 during the other period, i.e., a period W2. Therefore, the amplitude A2 of the inverter circuit carrier wave also varies in accordance with the step-up circuit voltage target value Vo*.

A waveform (hereinafter, may be referred to as an inverter circuit reference wave Vinv#) of the inverter voltage reference value Vinv# corresponds to a value calculated based on the inverter current target value Iinv* by the control processing unit 30, and is set to have generally the same amplitude as the voltage amplitude (288 volts) of the commercial power system 3. Therefore, the inverter circuit reference wave Vinv# crosses the inverter circuit carrier wave in a range where the voltage value is between −Vg.1 and +Vg.1.

The inverter circuit control unit 33 compares the inverter circuit carrier wave with the inverter circuit reference wave Vinv#, and generates drive waveforms for driving the switching elements Q1 to Q4 so as to be turned on during a period in which the inverter circuit reference wave Vinv# is equal to or greater than the inverter circuit carrier wave, and to be turned off during a period in which the inverter circuit reference wave Vinv# is equal to or smaller than the carrier wave.

In FIG. 12, (b) shows the drive waveform for driving the switching element Q1, generated by the inverter circuit control unit 33. In (b) of FIG. 12, the vertical axis indicates voltage and the horizontal axis indicates time. The horizontal axis in (b) of FIG. 12 coincides with that in (a) of FIG. 12.

The inverter circuit control unit 33 generates the drive waveform so that the switching operation is performed in the range W2 in which voltage of the inverter circuit reference wave Vinv# is between −Vg.1 and +Vg.1. Therefore, in the other range, the switching element Q1 is controlled to stop the switching operation.

In FIG. 12, (c) shows the drive waveform for driving the switching element Q3, generated by the inverter circuit control unit 33. In (c) of FIG. 12, the vertical axis indicates voltage and the horizontal axis indicates time.

The inverter circuit control unit 33 compares the carrier wave with a waveform indicated by a broken line in (a) of FIG. 12, which is inverted from the inverter circuit reference wave Vinv#, to generate the drive waveform for the switching element Q3.

Also in this case, the inverter circuit control unit 33 generates the drive waveform so that the switching operation is performed in the range W2 in which voltage of (a waveform inverted from) the inverter circuit reference wave Vinv# is between −Vg.1 and +Vg.1. Therefore, in the other range, the switching element Q3 is controlled to stop the switching operation.

The inverter circuit control unit 33 generates, as the drive waveform for the switching element Q2, a waveform inverted from the drive waveform for the switching element Q1, and generates, as the drive waveform for the switching element Q4, a waveform inverted from the drive waveform for the switching element Q3.

As described above, the inverter circuit control unit 33 modulates the inverter circuit carrier wave with the inverter circuit reference wave Vinv#, to generate the drive waveforms representing pulse widths for switching. The inverter circuit control unit 33 performs PWM control for the switching elements Q1 to Q4 of the inverter circuit 11, based on the generated drive waveforms.

The first step-up circuit control unit 32 of the present embodiment causes the first step-up circuit 10 to output power so that current flowing in the DC reactor 15 coincides with the step-up circuit current target value Iin.1*. As a result, the first step-up circuit 10 is caused to perform switching operation during the period W1 (FIG. 11) in which an absolute value of the inverter output voltage target value Vinv* is generally equal to or greater than the first DC input voltage detection value Vg.1. The first step-up circuit 10 outputs power having voltage equal to or greater than the first DC input voltage detection value Vg.1 and approximate to the absolute value of the inverter output voltage target value Vinv*, during the period W1. On the other hand, during the period in which the absolute value of the inverter output voltage target value Vinv* is generally equal to or smaller than the first DC input voltage detection value Vg.1, the step-up circuit control unit 32 stops the switching operation of the first step-up circuit 10. Therefore, during the period in which the absolute value is equal to or smaller than the first DC input voltage detection value Vg.1, the first step-up circuit 10 outputs, to the inverter circuit 11, DC power outputted from the first array 2 without stepping up the voltage thereof.

The inverter circuit control unit 33 of the present embodiment causes the inverter circuit 11 to output power so that current flowing in the AC reactor 22 coincides with the inverter current target value Iinv*. As a result, the inverter circuit 11 is caused to perform switching operation during the range W2 (FIG. 12) in which the inverter output voltage target value Vinv* is generally between −Vg.1 and +Vg.1. That is, the inverter circuit 11 is caused to perform switching operation during a period in which an absolute value of voltage of the inverter output voltage target value Vinv* is equal to or smaller than the first DC input voltage detection value Vg.1.

Therefore, while switching operation of the first step-up circuit 10 is stopped, the inverter circuit 11 performs switching operation to output AC voltage approximate to the inverter output voltage target value Vinv*.

On the other hand, in the period other than the period W2 in which voltage of the inverter output voltage target value Vinv* is generally between −Vg.1 and +Vg.1, the inverter circuit control unit 33 stops the switching operation of the inverter circuit 11. During this period, power stepped up by the first step-up circuit 10 is given to the inverter circuit 11. Therefore, the inverter circuit 11 whose switching operation is stopped outputs the power given from the first step-up circuit 10, without stepping down the voltage thereof That is, the inverter device 1 of the present embodiment causes the first step-up circuit 10 and the inverter circuit 11 to perform switching operations so as to be alternately switched therebetween, and superimposes their respective output powers on each other, thereby outputting AC power having a voltage waveform approximate to the inverter output voltage target value Vinv*.

As described above, in the present embodiment, control is performed so that the first step-up circuit 10 is operated in a case of outputting voltage corresponding to the part where voltage of AC power to be outputted from the inverter device 1 is higher than the first DC input voltage detection value Vg.1, and the inverter circuit 11 is operated in a case of outputting voltage corresponding to the part where the voltage of the AC power is lower than the first DC input voltage detection value Vg.1. Therefore, since the inverter circuit 11 does not step down the power that has been stepped up by the first step-up circuit 10, a potential difference in stepping down of the voltage can be reduced, whereby loss due to switching of the step-up circuit is reduced and AC power can be outputted with increased efficiency.

Further, for both the first step-up circuit 10 and the inverter circuit 11, since the inverter output voltage target value Vinv* is calculated based on the inverter current target value Iinv* set by the control unit 12, occurrence of deviation or distortion between power of the step-up circuit and power of the inverter circuit which are outputted so as to be alternately switched can be suppressed.

The first step-up circuit control unit 32 of the control processing unit 30 may control the first step-up circuit 10 so as to operate in a range higher than a voltage value slightly lower than the first DC input voltage detection value Vg.1, and to stop switching operation in a range equal to or smaller than the voltage value slightly lower than the first DC input voltage detection value Vg.1.

In this case, a period in which power outputted from the first step-up circuit 10 and power outputted from the inverter circuit 11 are superimposed on each other is intentionally provided, whereby current waveforms can be smoothly connected at a part where the first step-up circuit 10 and the inverter circuit 11 are switched to each other.

Here, the voltage value slightly lower than the first DC input voltage detection value Vg.1 means a voltage value set so as to allow for smooth connection between the current waveform outputted from the first step-up circuit 10 and the current waveform outputted from the inverter circuit 11, that is, a voltage value set to be lower than the first DC input voltage detection value Vg.1 so that output of the first step-up circuit 10 and output of the inverter circuit 11 are superimposed on each other to a degree required for smooth connection between both current waveforms.

Figure 13:
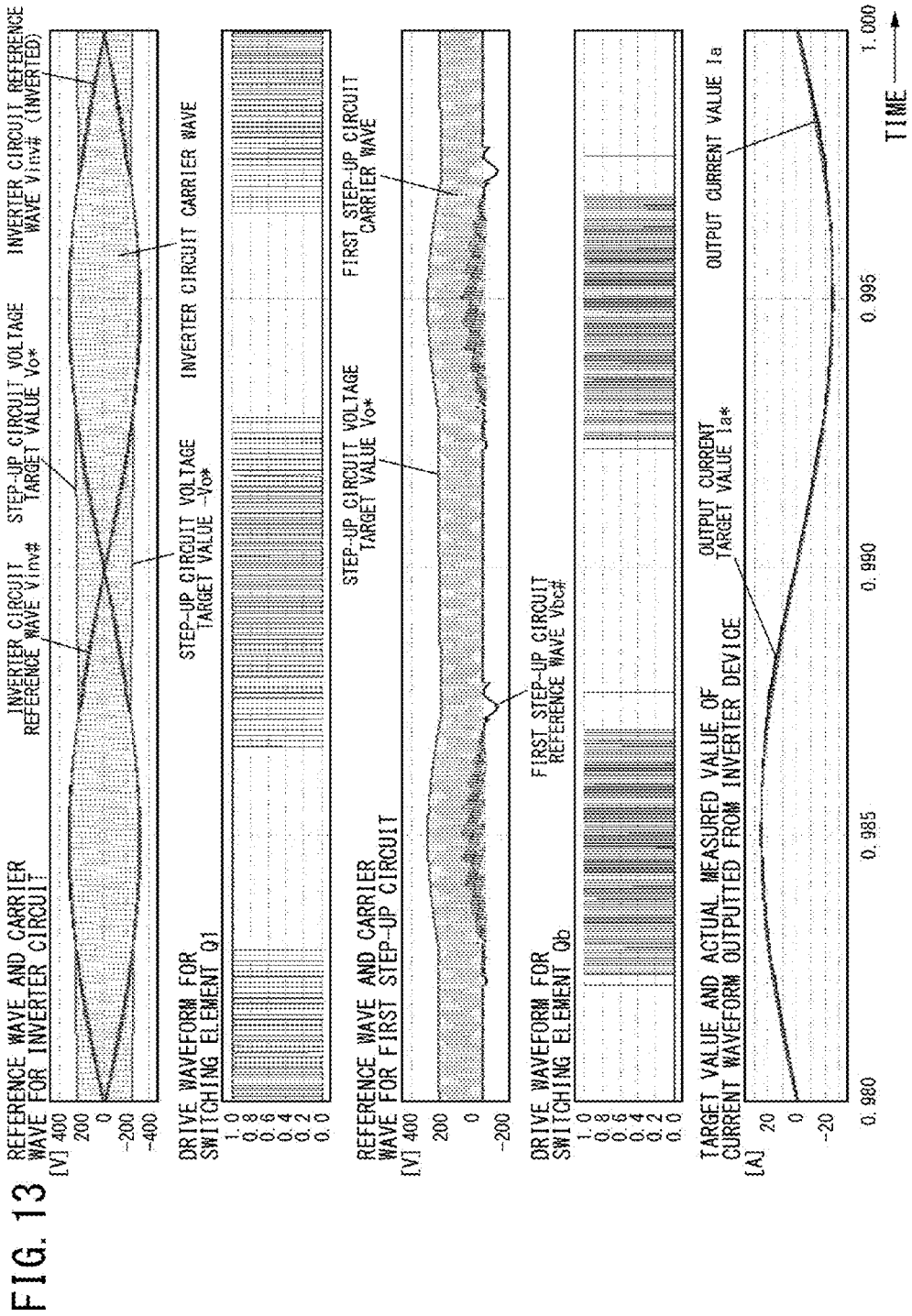
FIG. 13 is a diagram showing examples of reference waves and drive waveforms for switching elements.

FIG. 13 is a diagram showing examples of reference waves and drive waveforms for the switching elements Qb1 and Q1 to Q4.

FIG. 13 shows graphs of, from the uppermost side, the reference wave Vinv# and the carrier wave for the inverter circuit, the drive waveform for the switching element Q1, the reference wave Vbc1# and the carrier wave for the first step-up circuit, the drive waveform for the switching element Qb, and the target value and an actual measured value of a current waveform of AC power outputted from the inverter device 1. The horizontal axes of these graphs indicate time, and coincide with each other.

As shown in FIG. 13, it is found that output current is controlled so that an actual measured value Ia thereof coincides with a target value Ia*.

In addition, it is found that the period in which the switching element Qb1 of the first step-up circuit 10 performs switching operation and the period in which the switching elements Q1 to Q4 of the inverter circuit 11 perform switching operations are controlled so as to be alternately switched therebetween.

[5 Control for Second Step-up Circuit]

The second step-up circuit control unit 35 (FIG. 3) controls the switching element Qb2 of the second step-up circuit 41.

The second step-up circuit control unit 35 generates a second step-up circuit carrier wave, and modulates this carrier wave with the second step-up circuit voltage reference value Vbc2# given from the control processing unit 30, to generate a drive waveform for driving the switching element Qb2.

The second step-up circuit control unit 35 and the inverter circuit control unit 33 control each switching element based on the drive waveforms, thereby causing the inverter circuit 11 to output AC power having a voltage waveform approximate to a waveform of the inverter output voltage target value Vinv*.

Figure 14:
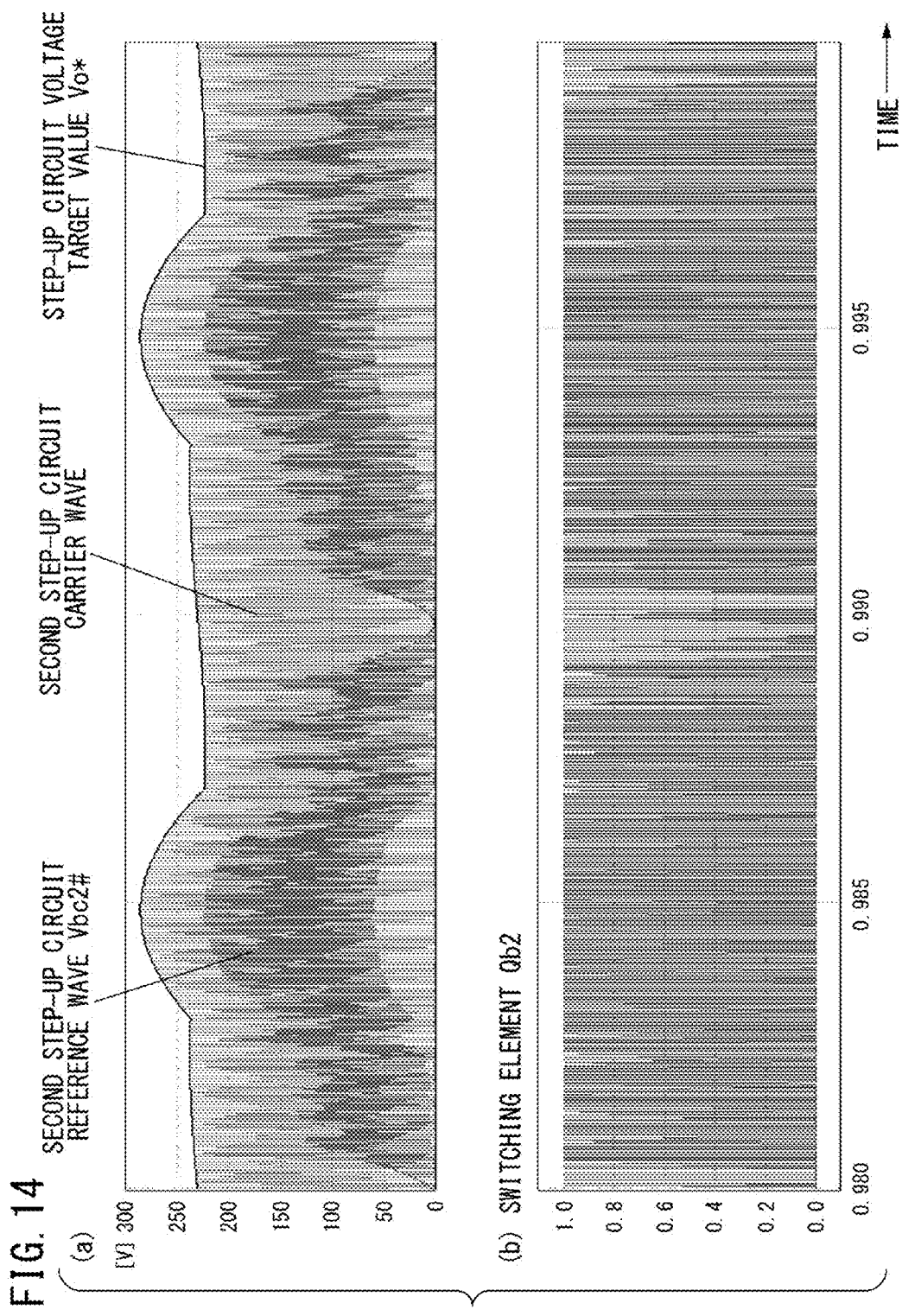
FIG. 14 is graphs in which (a) shows comparison between a second step-up circuit carrier wave and a waveform of a second step-up circuit voltage reference value Vbc2#, and (b) shows a drive waveform for driving a switching element, generated by a second step-up circuit control unit.

In FIG. 14, (a) is a graph showing comparison between the second step-up circuit carrier wave and a waveform of the second step-up circuit voltage reference value Vbc2#. In (a) of FIG. 14, the vertical axis indicates voltage and the horizontal axis indicates time.

The second step-up circuit carrier wave generated by the second step-up circuit control unit 35 is a triangle wave and has an amplitude set at the same value (amplitude A1) as the voltage amplitude of the step-up circuit voltage target value Vo*. The frequency of the second step-up circuit carrier wave is set by the second step-up circuit control unit 35 in accordance with a control command from the control processing unit 30, or the like, so as to realize a predetermined duty ratio.

In the present embodiment, the second DC input voltage detection value Vg.2 is 150 volts.

As described above, the step-up circuit voltage target value Vo* varies so as to follow an absolute value of the inverter output voltage target value Vinv* during a period in which the absolute value of the inverter output voltage target value Vinv* is generally equal to or greater than the first DC input voltage detection value Vg.1, and follow the first DC input voltage detection value Vg.1 during the other period. Therefore, the amplitude of the second step-up circuit carrier wave also varies in accordance with the step-up circuit voltage target value Vo*.

A waveform (hereinafter, may be referred to as a second step-up circuit reference wave Vbc2#) of the second step-up circuit voltage reference value Vbc2# corresponds to a value calculated based on the step-up circuit current target value Iin.2* by the control processing unit 30, and has almost a positive value over the entire range, unlike the first step-up circuit reference wave Vbc1#. Therefore, the second step-up circuit voltage reference value Vbc2# crosses almost the entire range of the second step-up circuit carrier wave.

The second step-up circuit control unit 35 compares the second step-up circuit carrier wave with the second step-up circuit voltage reference value Vbc2#, and generates a drive waveform for driving the switching element Qb2 so as to be turned on during a period in which the second step-up circuit voltage reference wave Vbc2# is equal to or greater than the second step-up circuit carrier wave, and to be turned off during a period in which the second step-up circuit reference wave Vbc2# is equal to or smaller than the second step-up circuit carrier wave.

In FIG. 14, (b) shows the drive waveform for driving the switching element Qb2, generated by the second step-up circuit control unit 35. In (b) of FIG. 14, the vertical axis indicates voltage and the horizontal axis indicates time. The horizontal axis in (b) of FIG. 14 coincides with that in (a) of FIG. 14.

The second step-up circuit voltage reference value Vbc2# crosses almost the entire range of the second step-up circuit carrier wave as described above. Therefore, the second step-up circuit control unit 35 generates a drive waveform so as to cause the switching element Qb2 to perform switching operation over the entire range.

As described above, the second step-up circuit control unit 35 modulates the second step-up circuit carrier wave with the second step-up circuit voltage reference value Vbc2#, to generate the drive waveform representing pulse widths for switching. The second step-up circuit control unit 35 performs PWM control for the switching element Qb2 of the second step-up circuit 41, based on the generated drive waveform.

While being controlled based on the above drive waveform, the second step-up circuit 41 outputs a current waveform approximate to the second step-up circuit current target value Iin.2*. Thus, the minimum voltage value of power outputted from the second step-up circuit 41 substantially coincides with the first DC input voltage detection value Vg.1 (see (b) in FIG. 9), whereby the voltage value of power outputted from the second step-up circuit 41 can be prevented from becoming greatly lower than the voltage value of power outputted from the first step-up circuit 10. As a result, occurrence of the period in which supply of power from the second array 40 through the second step-up circuit 41 is not obtained can be prevented, whereby reduction in power supply efficiency can be suppressed.

Voltage of power given from the second step-up circuit 41 to the inverter circuit 11 substantially coincides with voltage of power given from the first step-up circuit 10 to the inverter circuit 11 (power stepped up by the first step-up circuit 10 and DC power outputted from the first array 2). Therefore, power to be given from the second step-up circuit 41 to the inverter circuit 11 is superimposed on power to be given from the first step-up circuit 10 to the inverter circuit 11, and then the resultant power is given to the inverter circuit 11.

Based on the powers given from both step-up circuits 10 and 41, the inverter circuit 11 outputs AC power having a voltage waveform approximate to the inverter output voltage target value Vinv* as described above.

[6 Current Phase of Outputted AC Power]

Both step-up circuits 10 and 41 and the inverter circuit 11 of the present embodiment output AC power having a voltage waveform approximate to the inverter output voltage target value Vinv*, to the filter circuit 21 connected at the subsequent stage, through the control by the control unit 12. The inverter device 1 outputs AC power to the commercial power system 3 via the filter circuit 21.

Here, the inverter output voltage target value Vinv* is generated by the control processing unit 30 so as to have a voltage phase leading the voltage phase of the commercial power system 3 by several degrees as described above.

Therefore, AC voltage outputted by both step-up circuits 10 and 41 and the inverter circuit 11 also has a voltage phase leading the voltage phase of the commercial power system 3 by several degrees.

As a result, the AC voltage from both step-up circuits 10 and 41 and the inverter circuit 11 is applied to one end of the AC reactor 22 (FIG. 2) of the filter circuit 21, and voltage of the commercial power system 3 is applied to the other end. Thus, voltages having phases shifted from each other by several degrees are applied to the respective ends of the AC reactor 22.

Figure 15:
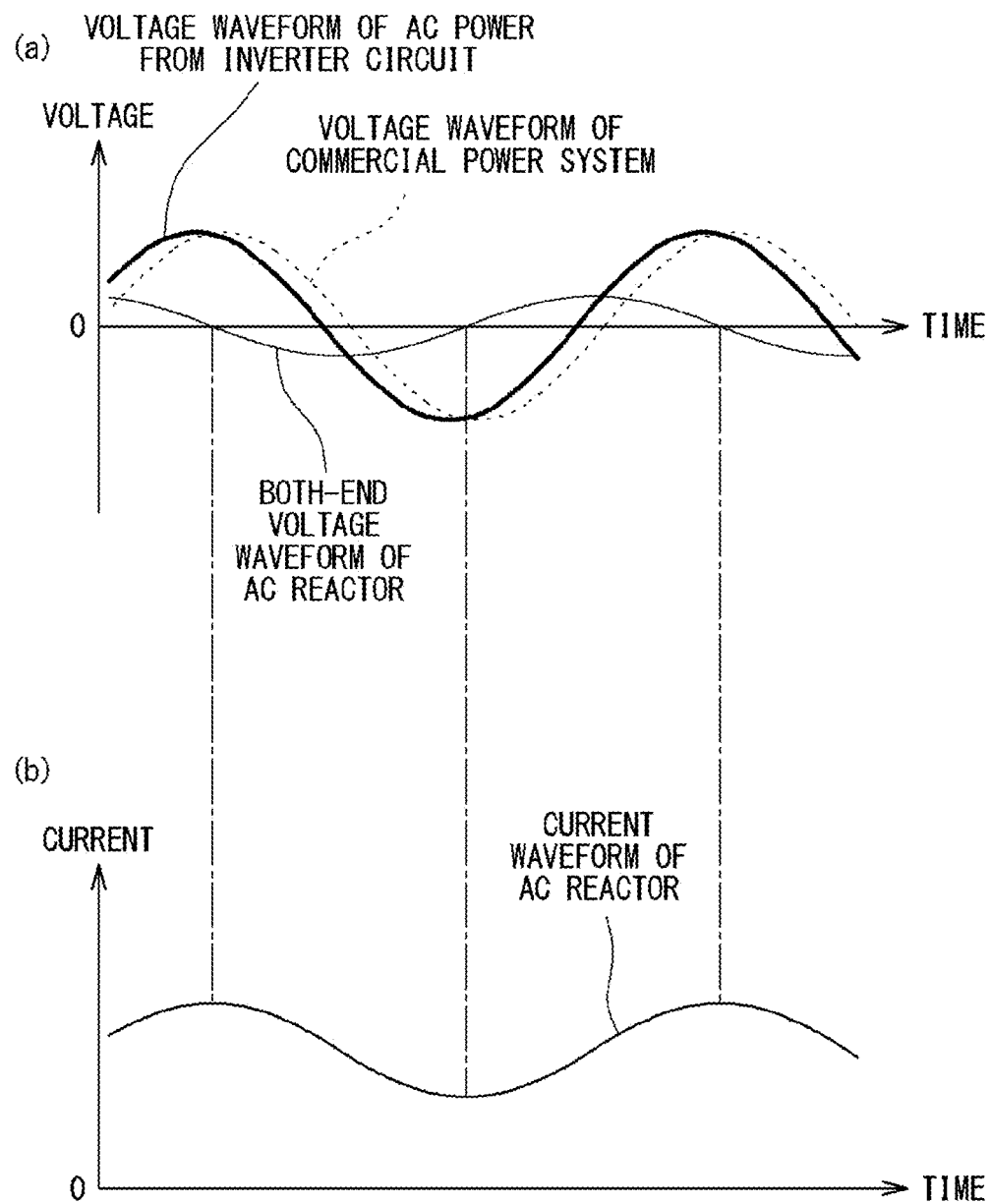
FIG. 15 is graphs in which (a) shows voltage waveforms of AC voltage outputted from the inverter circuit, a commercial power system, and voltage between both ends of an AC reactor, and (b) shows a waveform of current flowing in the AC reactor.

In FIG. 15, (a) is a graph showing voltage waveforms of AC voltage outputted from the inverter circuit 11, the commercial power system 3, and voltage between both ends of the AC reactor 22. In (a) of FIG. 15, the vertical axis indicates voltage and the horizontal axis indicates time.

As shown in (a) of FIG. 15, when voltages having phases shifted from each other by several degrees are applied to the respective ends of the AC reactor 22, the voltage between both ends of the AC reactor 22 is equal to a difference between the voltages applied to the respective ends of the AC reactor 22 and having phases shifted from each other by several degrees.

Therefore, as shown in (a) of FIG. 15, the phase of voltage between both ends of the AC reactor 22 leads the phase of voltage of the commercial power system 3 by 90 degrees.

In FIG. 15, (b) is a graph showing a waveform of current flowing in the AC reactor 22. In (b) of FIG. 15, the vertical axis indicates current and the horizontal axis indicates time. The horizontal axis in (b) of FIG. 15 coincides with that in (a) of FIG. 15.

The current phase of the AC reactor 22 lags the voltage phase thereof by 90 degrees. Therefore, as shown in (b) of FIG. 15, the current phase of AC power outputted through the AC reactor 22 is synchronized with the current phase of the commercial power system 3.

Therefore, although the phase of voltage outputted from the inverter circuit 11 leads the phase of the commercial power system 3 by several degrees, the phase of current outputted from the inverter circuit 11 coincides with the phase of current of the commercial power system 3.

Therefore, the phase of a current waveform of AC power outputted from the inverter device 1 coincides with the voltage phase of the commercial power system 3.

As a result, AC power in phase with voltage of the commercial power system 3 can be outputted.

[7 Others]

The present invention is not limited to the above embodiment. In the above embodiment, an example in which two solar battery arrays, i.e., the first array 2 and the second array 40 are connected in parallel to the inverter circuit 11 has been shown. However, for example, more solar battery arrays may be connected, and more step-up circuits to which the solar battery arrays are connected may be connected. In this case, among the more solar battery arrays connected, a solar battery array that outputs power having the highest voltage value can be used as the first array 2 of the above embodiment, and other arrays can be used as the second array 40 of the above embodiment.

Also in this case, a voltage value at an optimum operation point of a solar battery array having the highest voltage value is used as a first input voltage set value Vset1, and other solar battery arrays are controlled so that the minimum voltage value of power outputted from the other solar battery arrays substantially coincides with the first input voltage set value Vset1.

Also in this case, occurrence of the period in which supply of powers from multiple solar battery arrays is not obtained can be prevented, whereby reduction in efficiency of the inverter device 1 can be suppressed.

In the above embodiment, the amplitudes of the carrier waves for the inverter circuit, the first step-up circuit, and the second step-up circuit are set at the step-up circuit voltage target value Vo*. However, a voltage sensor for detecting voltage between both ends of the capacitor 19 may be provided to obtain a step-up circuit voltage detection value Vo, and the control may be performed using the step-up circuit voltage detection value Vo.

In this case, the step-up circuit voltage detection value Vo can be used as the amplitude of each carrier wave. Thus, even when the system voltage or output voltage of the DC power supply varies, AC current with reduced distortion can be outputted.

[8 Supplementary Note]

It has been verified that the same result as in each simulation in the above embodiments can be obtained using an actual machine.

«AC-to-DC Conversion Device»

[Overall Configuration]

Next, an embodiment of a conversion device 1R that performs power conversion from AC to DC will be described.

Figure 16:
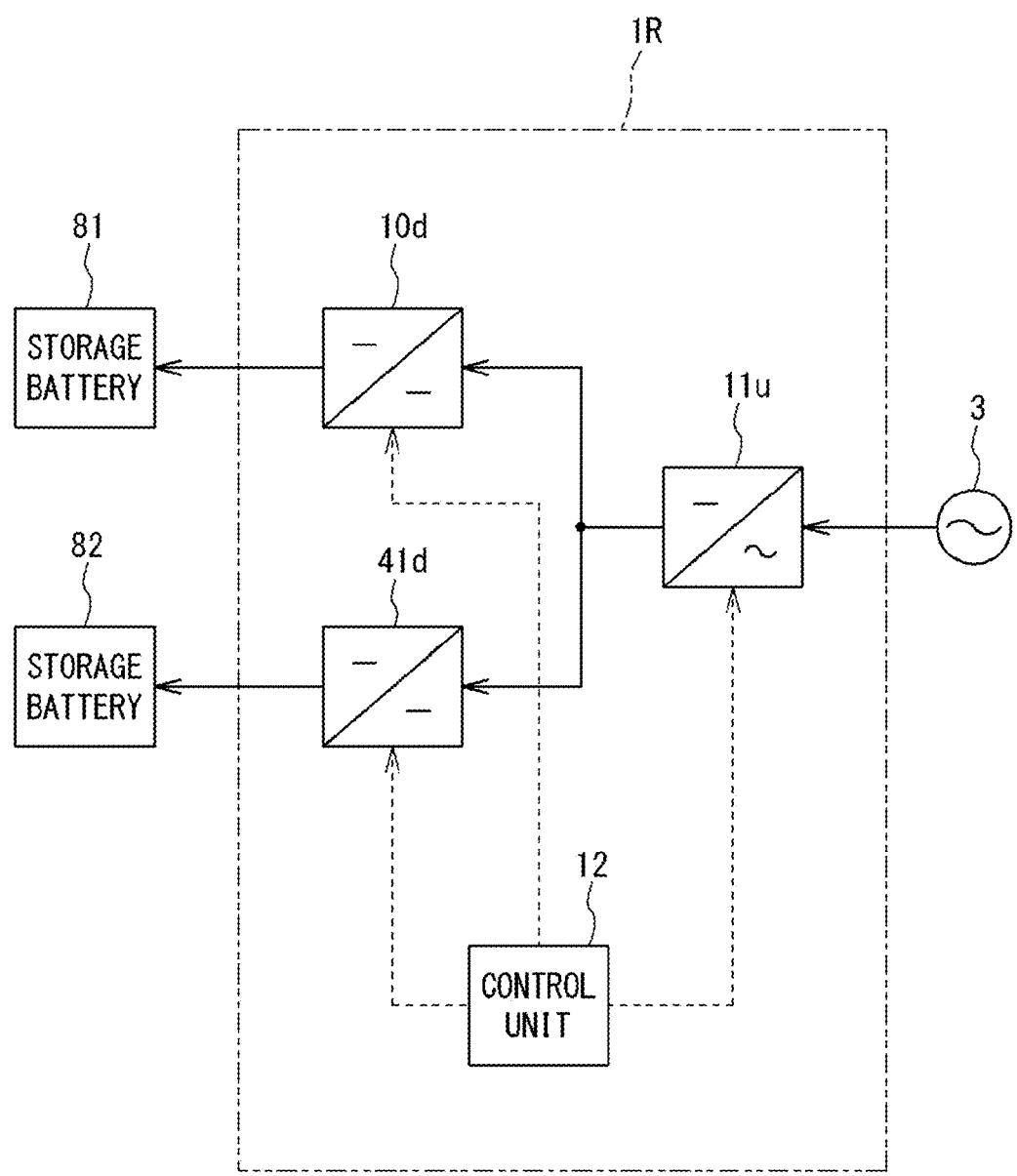
FIG. 16 is a block diagram showing an example of a power storage system including a conversion device that performs power conversion from AC to DC.

FIG. 16 is a block diagram showing an example of a power storage system including the conversion device 1R. In FIG. 16, storage batteries 81 and 82 are connected to output ends of two systems of the conversion device 1R, and the commercial power system 3 (AC system) is connected to an input end of the conversion device 1R. The power storage system is capable of converting power provided from the commercial power system 3, from AC to DC, and storing the converted power in the storage batteries 81 and 82.

The conversion device 1R includes: an AC/DC converter 11u which converts AC power received from the commercial power system 3 to DC power; a first step-down circuit 10d and a second step-down circuit 41d which are DC/DC converters which step down output voltage of the AC/DC converter 11u; and the control unit 12 which controls operations of these circuits 10d, 11u, and 41d. As is obvious from comparison with FIG. 1, the direction of energy flow is reversed.

Figure 17:
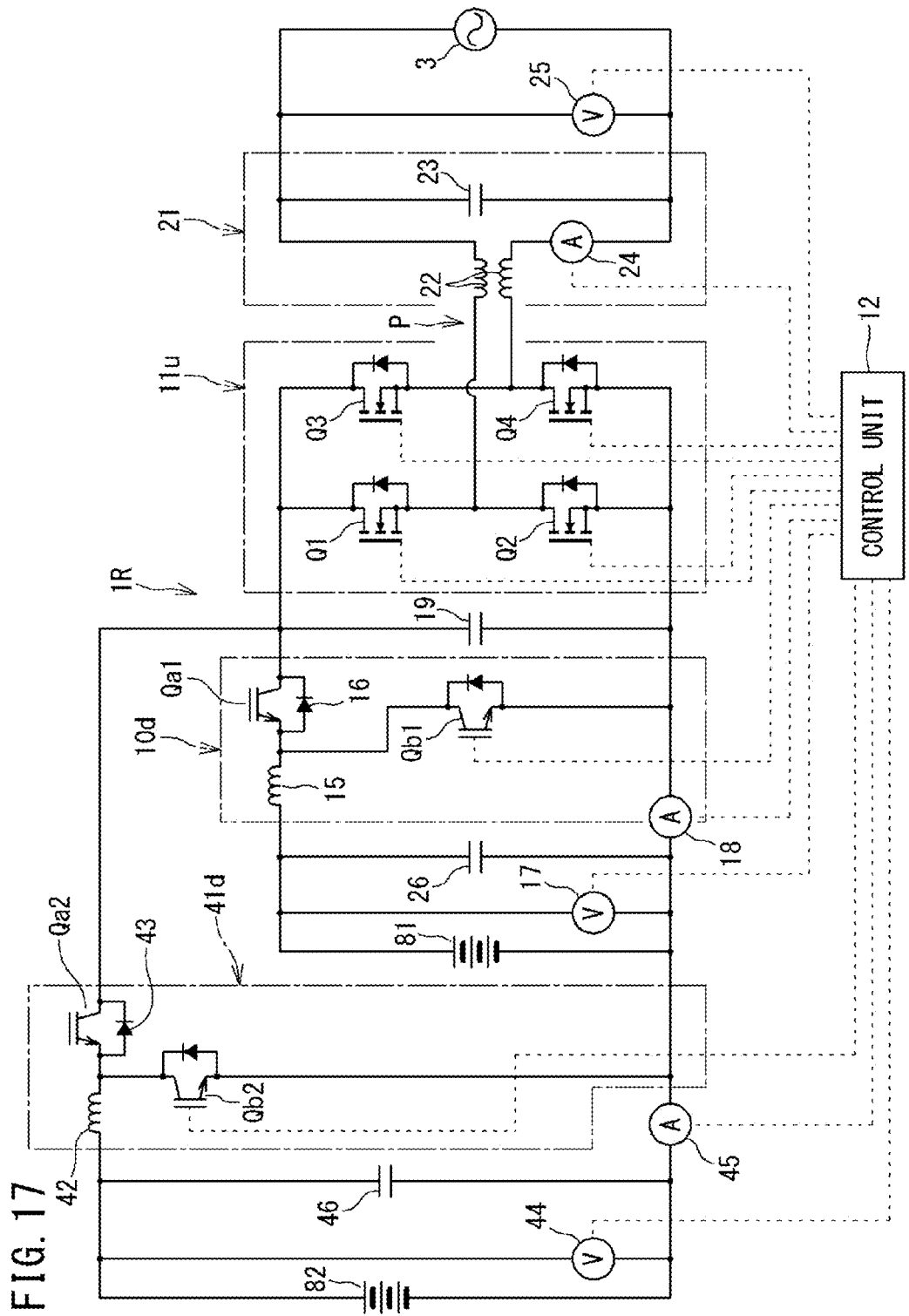
FIG. 17 is an example of a circuit diagram of the conversion device in FIG. 16.

FIG. 17 is an example of a circuit diagram of the conversion device 1R. As a difference from FIG. 2, first, the solar battery arrays 2 and 40 in FIG. 2 are replaced with the storage batteries 81 and 82. In addition, in the conversion device 1R, the first step-up circuit 10 and the second step-up circuit 41 in FIG. 2 are replaced with the first step-down circuit 10d and the second step-down circuit 41d, and the inverter circuit 11 in FIG. 2 is replaced with the AC/DC converter 11u which is capable of also step-up operation in cooperation with the AC reactor 22 though the components thereof are the same.

The first step-down circuit 10d and the second step-down circuit 41d are provided with switching elements Qa1 and Qa2 in parallel with the same diodes 16 and 43 as in FIG. 2, respectively. As the switching elements Qa1 and Qa2, the shown IGBT or FET can be used, for example.

The other configuration of the conversion device 1R is basically the same as that of the inverter device 1 in FIG. 2. Therefore, the conversion device 1R has a bidirectional property, and is capable of performing the same operation as in the inverter device 1 in FIG. 2 when a photovoltaic panel is connected. In addition, the conversion device 1R is also capable of performing autonomous operation by converting DC power of the storage batteries 81 and 82 to AC power.

In a case where the conversion device 1R operates as an inverter device, the switching elements Qa1 and Qa2 are controlled by the control unit 12 so that the switching elements Qa1 and Qa2 are OFF constantly or so that the switching element Qa1 is turned on alternately with the switching element Qb1 and the switching element Qa2 is turned on alternately with the switching element Qb2. In addition, the first step-down circuit 10d and the second step-down circuit 41d respectively serve as step-up circuits, and the AC/DC converter 11u serves as an inverter circuit.

In a case of charging the storage batteries 81 and 82 based on AC power of the commercial AC system 3, the control unit 12 can perform synchronous rectification by controlling operations of the switching elements Q1 to Q4. In addition, by performing PWM control under the presence of the AC reactor 22, the control unit 12 can perform rectification while performing step-up operation. Thus, the AC/DC converter 11u converts AC power given from the commercial AC system 3 to DC power.

The first step-down circuit 10d forms a step-down chopper circuit, and the switching elements Qb1 and Qa1 are controlled by the control unit 12. The second step-down circuit 41d forms a step-down chopper circuit, and the switching elements Qb2 and Qa2 are controlled by the control unit 12.

The switching operations of the first step-down circuit 10d and the second step-down circuit 41d are controlled so that a period in which each of the first step-down circuit 10d and the second step-down circuit 41d performs switching operation and a period in which the AC/DC converter 11u performs switching operation are alternately switched. Therefore, during a period in which each of the first step-down circuit 10d and the second step-down circuit 41d performs switching operation, the respective step-down circuits output stepped-down voltages to the storage batteries 81 and 82, and during a period in which each step-down circuit stops the switching operation (the switching element Qb1, Qb2 is OFF and the switching element Qa1, Qa2 is ON), the respective step-down circuits give DC voltages outputted from the AC/DC converter 11u and inputted to the first step-down circuit 10d and the second step-down circuit 41d, to the storage batteries 81 and 82 via the DC reactors 15 and 42, respectively. However, depending on the charge states and voltages of the storage batteries 81 and 82, for the purpose of voltage adjustment, while one of the first step-down circuit 10d and the second step-down circuit 41d stops switching operation, the other one may perform switching operation for step-down operation.

[Summary of Voltage Waveform]

Figure 18:
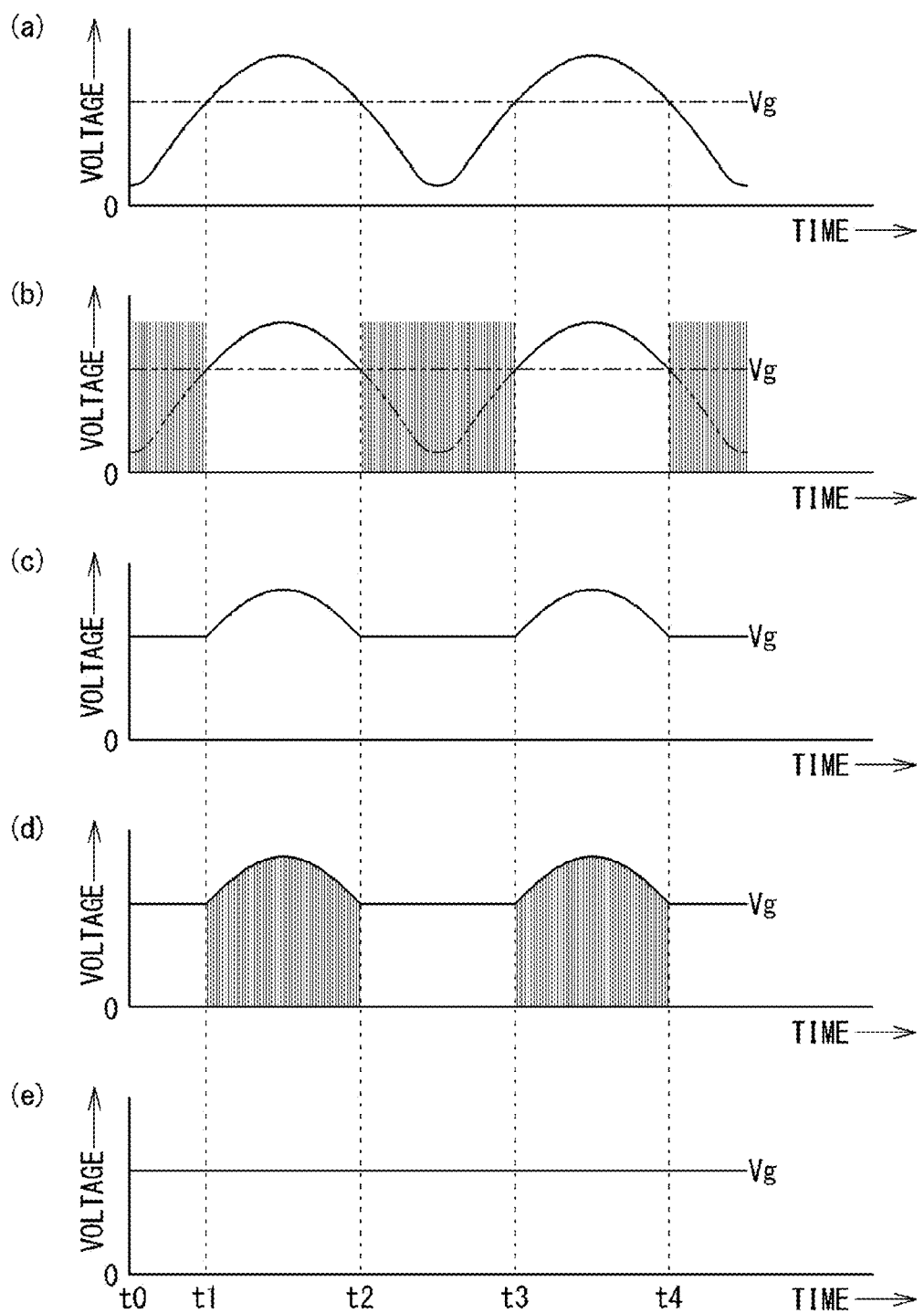
FIG. 18 is a diagram of a voltage waveform schematically showing operation of the conversion device in FIG. 16.

FIG. 18 is a voltage waveform diagram conceptually showing operation of the conversion device 1R.

In FIG. 18, (a) shows an example of an absolute value of an AC input voltage target value Vinv* for the AC/DC converter 11u. This generally corresponds to a full-wave-rectified waveform based on the commercial AC. A two-dot dashed line indicates DC voltage Vg for charging (which is the same as in expression (7)). As shown in (b) of FIG. 18, during periods (from t0 to t1, from t2 to t3, from t4) in which the DC voltage Vg is higher than the absolute value of the AC input voltage target value Vinv*, the AC/DC converter 11u performs switching operation and performs step-up operation in cooperation with the AC reactor 22.

Meanwhile, during these periods (from t0 to t1, from t2 to t3, from t4), at least one of the first step-down circuit 10d and the second step-down circuit 41d stops step-down operation. It is noted that thin stripes shown in (b) of FIG. 18 are actually a PWM pulse train, and the duty thereof varies in accordance with the absolute value of the AC input voltage target value Vinv*. Therefore, if the voltage in this state is applied to the storage battery 81, 82, a waveform as shown in (c) of FIG. 18 appears.

On the other hand, during periods (from t1 to t2, from t3 to t4) in which the DC voltage Vg is lower than the absolute value of the AC input voltage target value Vinv*, the AC/DC converter 11u stops switching, and instead, the first step-down circuit 10d and the second step-down circuit 41d operate. The switching mentioned here means high-frequency switching at about 20 kHz, for example, and does not mean switching at such a low frequency (twice as high as the commercial frequency) that is used for performing synchronous rectification. Even if the switching elements Q1 to Q4 are all OFF due to stop of switching in the AC/DC converter 11u, voltage rectified through the diodes included in the switching elements Q1 to Q4 is inputted to the first step-down circuit 10d and the second step-down circuit 41d. Here, in order to reduce conduction loss, it is preferable to perform synchronous rectification.

In the AC/DC converter 11u in a case of performing synchronous rectification, through control by the control unit 12, during a period in which the sign of the AC voltage Va is positive, the switching elements Q1 and Q4 are ON and the switching elements Q2 and Q3 are OFF, and during a period in which the sign of the AC voltage Va is negative, ON and OFF of these switching elements are inverted. The frequency of the inversion is twice as high as the commercial frequency, and thus is very low as compared to the high-frequency switching frequency. Therefore, loss due to the ON/OFF inversion is extremely small.

Meanwhile, during the periods (from t1 to t2, from t3 to t4), the first step-down circuit 10d and the second step-down circuit 41d perform step-down operations. Thin stripes shown in (d) of FIG. 18 are actually a PWM pulse train, and the duty thereof varies in accordance with the absolute value of the AC input voltage target value Vinv*. As a result of the step-down operation, desired DC voltage Vg shown in (e) of FIG. 18 is obtained.

As described above, only during a period in which the absolute value of the AC input voltage target value Vinv* based on AC voltage is lower than the DC voltage Vg, the AC/DC converter 11u operates, and during the other period, switching in the AC/DC converter 11u is stopped, whereby switching loss in the AC/DC converter 11u can be reduced.

Similarly, only during a period in which the absolute value of the AC input voltage target value Vinv* is higher than the DC voltage Vg, the first step-down circuit 10d and the second step-down circuit 41d operate, and during the other period, switching in at least one of the first step-down circuit 10d and the second step-down circuit 41d is stopped, whereby switching loss in the first step-down circuit 10d and the second step-down circuit 41d can be reduced.

Thus, the AC/DC converter 11u and at least one of the first step-down circuit 10d and the second step-down circuit 41d alternately perform switching operations. That is, for each of the AC/DC converter 11u, the first step-down circuit 10d, and the second step-down circuit 41d, a period in which switching is stopped arises. In addition, since the AC/DC converter 11u operates in a region other than the peak of the absolute value of the AC input voltage target value Vinv* and the vicinity thereof, voltage at which the AC/DC converter 11u performs switching is relatively low. This also contributes to reduction in switching loss. Thus, switching loss in the conversion device 1R as a whole can be greatly reduced.

[Specifications of Control]

Control of the conversion device 1R can be considered to be similar control obtained by reversing the direction of the control in system interconnection by the inverter device 1 in FIG. 2. This control is suitable for, with use of the conversion device 1R which can perform the same system interconnection as in the inverter device 1, enhancing the efficiency of the conversion device 1R also in the reversed operation.

Various values in the inverter device 1, and various values in the conversion device 1R corresponding thereto are as follows. It is noted that, if the storage battery 81 and the first step-down circuit 10d are set as a first DC system and the storage battery 82 and the second step-down circuit 41d are set as a second DC system, the first DC system corresponds to a case of i=1, and the second DC system corresponds to a case of i=2.

Ia.i*: a target value for input current from the commercial power system 3
Iin.i: a step-down circuit current detection value
Iin.i*: a step-down circuit current target value
Iinv*: a target value for AC input current to the AC/DC converter 11u
Ig.i*: a target value for DC input current to the storage battery 81, 82
Ic: current flowing through the capacitor 19
Ica: current flowing through the capacitor 23
Va: a system voltage detection value
Vg.i: a storage battery voltage value
Vinv*: a target value for AC input voltage to the AC/DC converter 11u
Vo*: a target value for input voltage to the first, second step-down circuit 10d, 41d
Pin.i: input power to the storage battery 81, 82
$P_{LOSS}$: power loss in the conversion device 1R
ηi: a conversion efficiency Therefore, it is possible to apply the following relationships corresponding to the aforementioned expressions (1) to (8) for the inverter device 1 in FIG. 2.

An average value <Pin.i> of input power to the storage battery 81, 82, corresponding to expression (1), is represented as follows.

$$<Pin.i> = <Iin.i \times Vg.i> \tag{R1}$$

An effective value <Ia.i*> of the target value for input current from the commercial power system 3 to each storage battery, corresponding to expression (2), is represented as follows.

$$<Ia.i> = <Ig.a^* \times Vg.i>/(<Va>\eta i) \tag{R2}$$

The input current target value Ia* corresponding to expression (3) is represented as follows.

$$Ia.i^* = (\sqrt{2}) \times <Ia.i^*> \times \sin \omega t \tag{R3}$$

The AC input current target value Iinv* corresponding to expression (4) is represented as follows.

$$Iinv^* = \Sigma Ia.i^* - sCaVa \tag{R4}$$

The above expression (R4) is represented as follows, using a derivative with respect to time t.

$$Iinv^* = \Sigma Ia.i^* - Ca \times (dVa/dt) \tag{R4a}$$

The AC input voltage target value Vinv* corresponding to expression (5) is represented as follows.

$$Vinv^* = Va - Za Iinv^* \tag{R5}$$

The above expression (R5) is represented as follows, using a derivative with respect to time t.

$$Vinv^* = Va - Za \times (dIinv^*/dt) \tag{R5a}$$

As described above, the input target values (Iinv*, Vinv*) for the AC/DC converter 11u which are AC-side target values are set at a circuit connection point P between the AC/DC converter 11u and the filter circuit 21, shown in FIG. 17. Therefore, as in a case of performing system interconnection, a point where the target values are set is moved to a stage (AC/DC converter 11u side) preceding to a circuit connection point between the commercial power system 3 and the conversion device 1R. By such, as it were, "reverse" system interconnection, appropriate interconnection between AC and DC is performed.

As for the input voltage target value Vo* for the first step-down circuit 10d and the second step-down circuit 41d corresponding to expression (6), Vgf, i.e., (Vg−Z Iin.i*) in expression (6) is replaced with Vgr, i.e., (Vg+Z Iin.i*), to obtain the following expression.

$$Vo^* = \mathrm{Max}(Vg + Z\ Iin.i^*, \text{absolute value of } Vinv^*) \tag{R6}$$

As in expression (7), the greatest one of the voltage values of the storage batteries 81 and 82 can be employed as the storage battery voltage value Vg.

$$Vg = \mathrm{Max}(Vg.i) \tag{R7}$$

The step-down circuit current target value Iin.i* is represented as follows.

$$Iin.i^* = [Ia.i^* \times Vinv^* - Ki\{(sCaVa)Vinv^* + (sCoVo^*) \times Vo^*\}]/(Vg.i + ZIin.i) \tag{R8}$$

The above expression (R8) is represented as follows, using a derivative with respect to time t.

$$Iin.i^* = [Ia.i^* \times Vinv^* - Ki\{(Ca \times dVa/dt) \times Vinv^* + (Co \times dVo^*/dt) \times Vo^*\}]/(Vg.i + ZIin.i) \quad (R8a)$$

If current flowing through the capacitor 19 is detected and the detected current is denoted by Ico, the following expression is obtained.

$$Iin.i^* = [Ia.i^* \times Vinv^* - Ki\{(Ca \times dVa/dt)Vinv^* + Ico \times Vo^*\}]/(Vg.i + ZIin.i) \quad (R8b)$$

In expressions (R8), (R8a), and (R8b), the third term is a value added in consideration of reactive power passing through the capacitor 19. That is, consideration of the reactive power in addition to the power target value for the AC/DC converter 11u allows for more accurate calculation of the value of Iin*.

Further, if power loss $P_{LOSS}.i$ of the inverter device 1 is measured in advance, the above expression (R8a) can be represented as follows.

$$Iin.i^* = [Ia.i^* \times Vinv^* - Ki\{(Ca \times dVa/dt)Vinv^* + (C \times dVo^*/dt) \times Vo^*\} - P_{LOSS}.i]/(Vg.i + ZIin.i) \quad (R8c)$$

Similarly, the above expression (R8b) can be represented as follows.

$$Iin.i^* = [Ia.i^* \times Vinv^* - Ki\{(Ca \times dVa/dt)Vinv^* + Ico \times Vo^*\} - P_{LOSS}.i]/(Vg.i + ZIin.i) \quad (R8d)$$

In this case, consideration of the reactive power and the power loss $P_{LOSS}$ in addition to the power target value of the inverter circuit 11 allows for more strict calculation of the value of Iin.i*.

As described above, the control unit 12 performs control so that the first step-down circuit 10d and the second step-down circuit 41d are operated in a case of outputting voltage corresponding to the part where the absolute value of the AC input voltage target value Vinv* for the AC/DC converter 11u is higher than the DC voltage (Vg+Z Iin.i*), and the AC/DC converter 11u is operated in a case of outputting voltage corresponding to the part where the absolute value of the AC input voltage target value Vinv* for the AC/DC converter 11u is lower than the DC voltage (Vg+Z Iin.i*). Therefore, a potential difference in step-up operation by the AC/DC converter 11u can be reduced, and loss due to switching of the AC/DC converter 11u, the first step-down circuit 10d, and the second step-down circuit 41d is reduced, whereby DC power can be outputted with increased efficiency.

Further, since the first step-down circuit 10d, the second step-down circuit 41d, and the AC/DC converter 11u all operate based on the target values set by the control unit 12, occurrence of phase-deviation or distortion in AC current inputted to the AC/DC converter 11u can be suppressed even if operation is performed so as to alternately switch the high-frequency switching period between the AC/DC converter 11u and each of the first step-down circuit 10d and the second step-down circuit 41d.

In addition, as described above, the conversion device 1R can perform the same system interconnection operation as in the inverter device 1 in FIG. 2. Therefore, it is possible to realize an efficient conversion device that can be used in both directions of DC/AC conversion to perform system interconnection, and AC/DC conversion.

«Complex Conversion Device—First Example»

Next, an example of the conversion device 1R that performs complex power conversion will be described.

Figure 19:
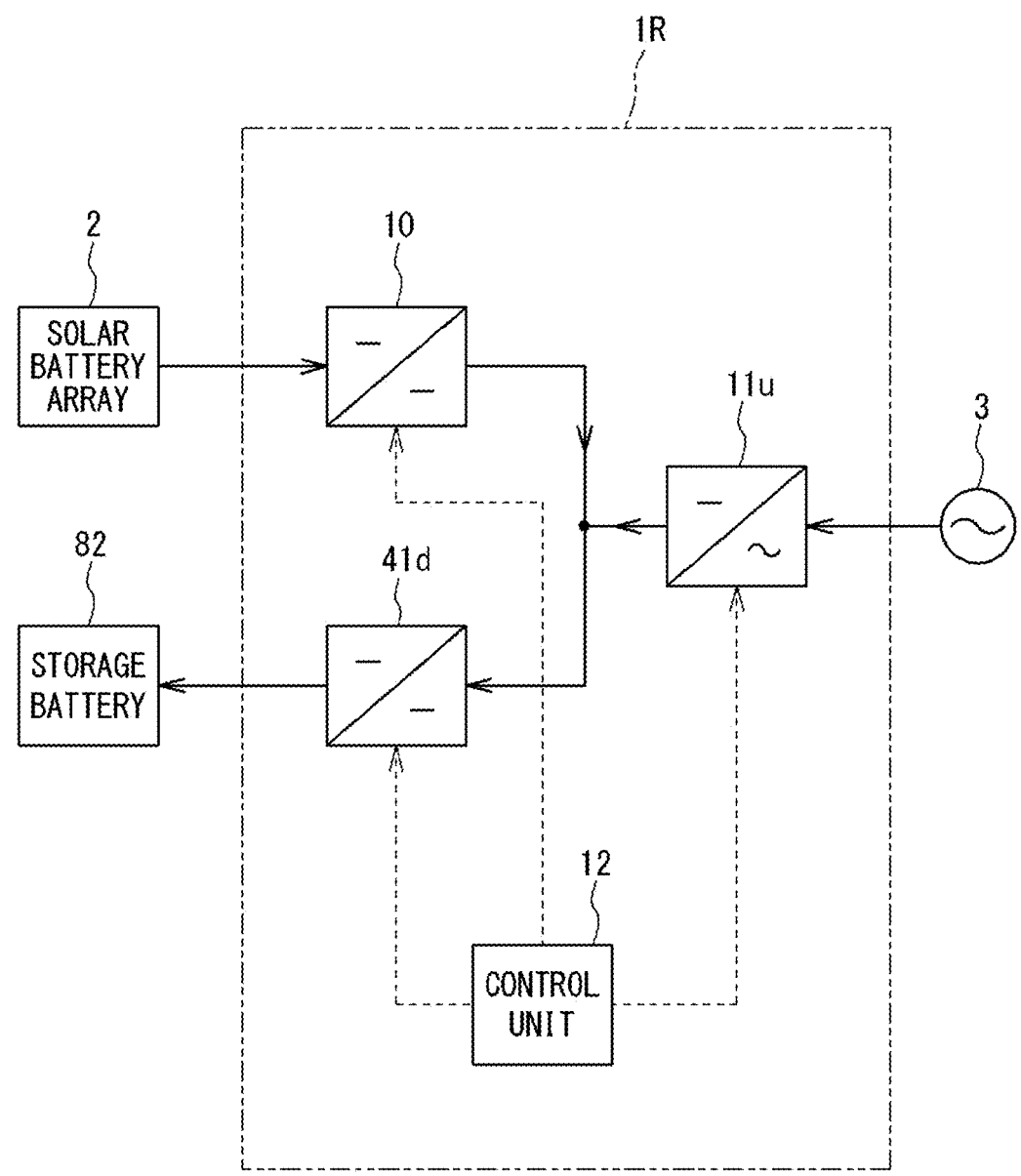
FIG. 19 is a block diagram showing an example of a power storage system including a conversion device that performs complex power conversion.

FIG. 19 is a block diagram showing an example of a power storage system including this conversion device 1R. FIG. 19 is different from FIG. 16 in that one system of the DC power supplies is replaced with the solar battery array 2 and the DC/DC converter 10 as a step-up circuit is provided.

In this case, the storage battery 82 is charged from the commercial power system 3 via the AC/DC converter 11u and the DC/DC converter 41d. The voltage of output of the solar battery array 2 is stepped up by the DC/DC converter 10 and the resultant power is outputted as DC power. This power is used for charging the storage battery 82 via the DC/DC converter 41d.

If the solar battery array 2 is defined as a first system (i=1) and the storage battery 82 is defined as a second system (i=2), control for the AC/DC converter 11u and the step-down circuit (DC/DC converter) 41d is enabled by, in a case of i=1 in expressions (R1) to (R8d), setting the sign of Ig.1* to be negative and using expression (2) instead of expression (R2). In this case, Ia.1 obtained by expression (2) and expression (R3) has an AC waveform having a phase shifted by 180 degrees relative to Va, and Ia.2 obtained by expression (2) and expression (R3) has an AC waveform having the same phase as Va. Subsequently, the control target values are calculated in accordance with expressions (R4) to (R8d). In a case where output power from the first system and input power to the second system coincide with each other, in output current to the commercial power system 3 obtained by expression (R4), active power is zero and only reactive power is present, but there is no problem in the subsequent calculations from expression (R5).

Through such control, output of the solar battery array 2 can be used for charging the storage battery 82.

«Complex Conversion Device—Second Example»

Next, another example of the conversion device 1R that performs complex power conversion will be described.

Figure 20:
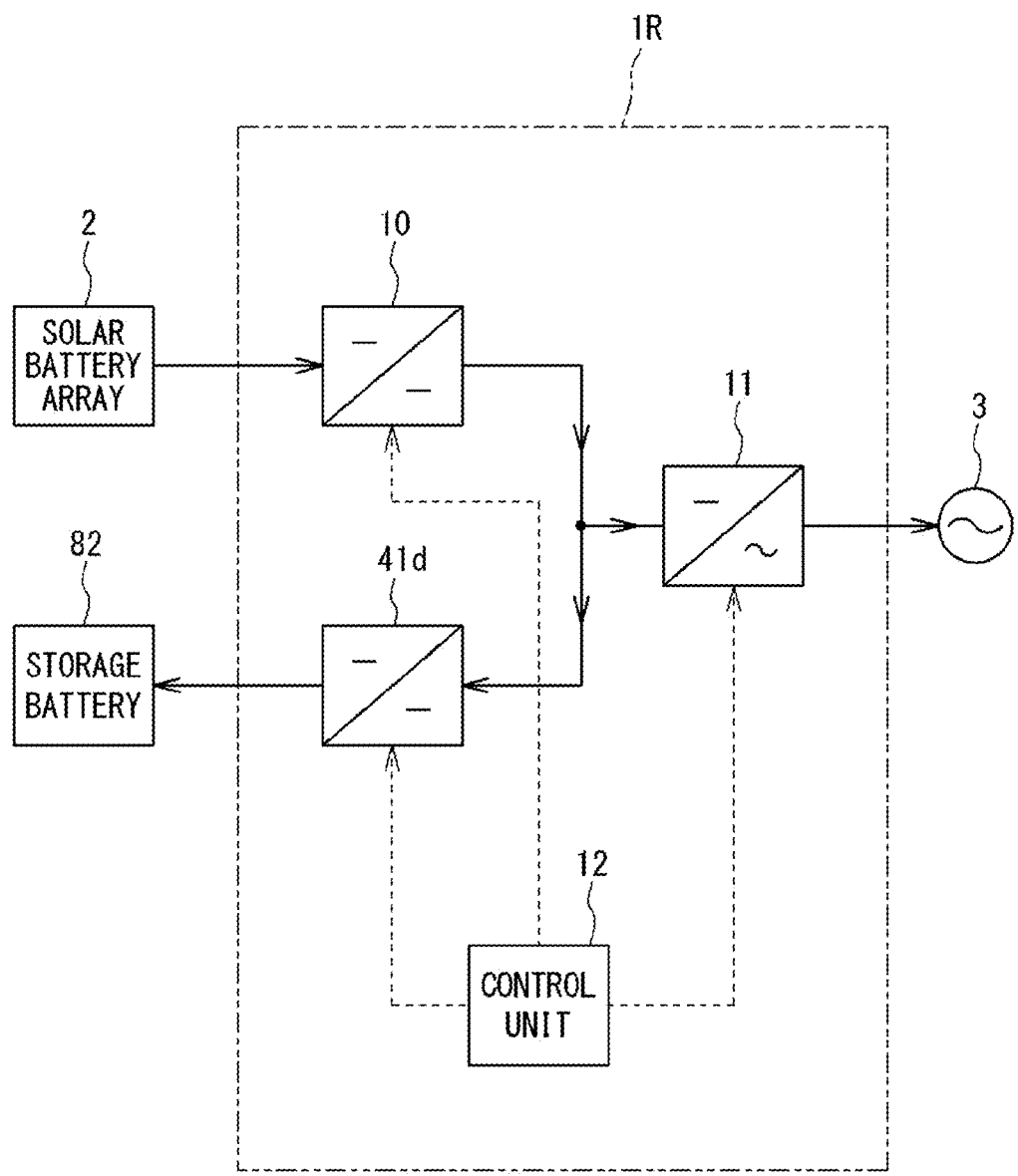
FIG. 20 is a block diagram showing another example of a power storage system including a conversion device that performs complex power conversion.

FIG. 20 is a block diagram showing an example of a power storage system including this conversion device 1R. FIG. 20 is different from FIG. 16 in that one system of the DC power supplies is replaced with the solar battery array 2 and the DC/DC converter 10 as a step-up circuit is provided (this is the same as in FIG. 19), and in that the AC/DC converter 11 operating as an inverter is provided.

In this case, the voltage of output of the solar battery array 2 is stepped up by the DC/DC converter 10 and the resultant power is outputted as DC power. This power is used for charging the storage battery 82 via the DC/DC converter 41d. The residual power after the power is used for charging the storage battery 82 can be sold by system interconnection via the AC/DC converter 11.

If the solar battery array 2 is defined as a first system (i=1) and the storage battery 82 is defined as a second system (i=2), control for the AC/DC converter 11 and the step-up circuit (DC/DC converter) 10 is enabled by, in a case of i=2 in expressions (1) to (8d), setting the sign of Ig.2* to be negative and using expression (R2) instead of expression (2). In this case, Ia.2 obtained by expression (R2) and expression (3) has an AC waveform having a phase shifted by 180 degrees relative to Va, and Ia.1 obtained by expression (R2) and expression (3) has an AC waveform having the same phase as Va. Subsequently, the control target values are calculated in accordance with expressions (4) to (8d). In a case where output power from the first system and input power to the second system coincide with each other, in output current to the commercial power system 3 obtained by expression (4), active power is zero and only reactive power is present, but there is no problem in the subsequent calculations from expression (5).

Through such control, the storage battery 82 is charged by photovoltaic generation while the residual power can be sold by system interconnection.

«Supplement»

It is desirable that, in the circuit configurations in FIG. 2 and FIG. 17, SiC elements are used for at least one of the semiconductor switching elements included in the DC/DC converter 10, 10d, 41, 41d, and the semiconductor switching elements included in the DC/AC inverter 11 (or AC/DC converter 11u).

In the above conversion device 1, switching loss in the semiconductor elements and iron loss in the DC reactors 15 and 42 and the AC reactor 22 can be reduced by decrease in the number of times of high-frequency switching, but conduction loss in the semiconductor elements cannot be reduced. In this regard, using SiC elements as the semiconductor elements enables reduction in the conduction loss. Therefore, if SiC elements are used for the conversion device 1 controlled as described above, a high conversion efficiency can be achieved by the synergistic effect therebetween.

It is noted that the embodiments disclosed herein are merely illustrative in all aspects and should not be recognized as being restrictive. The scope of the present invention is defined by the scope of the claims rather than the meaning described above, and is intended to include meaning equivalent to the scope of the claims and all modifications within the scope.

REFERENCE SIGNS LIST 1 inverter device (conversion device)
1R conversion device
2 first solar battery array/first array
3 commercial power system
10 first step-up circuit (DC/DC converter)
10d first step-down circuit (DC/DC converter)
11 inverter circuit
11u AC/DC converter
12 control unit
15 DC reactor
16 diode
17 first voltage sensor
18 first current sensor
19 capacitor
21 filter circuit
22 AC reactor
23 capacitor
24 third current sensor
25 third voltage sensor
26 capacitor
30 control processing unit
32 first step-up circuit control unit
33 inverter circuit control unit
34 averaging processing unit
35 second step-up circuit control unit
40 second solar battery array/second array
41 second step-up circuit (DC/DC converter)
41d second step-down circuit (DC/DC converter)
42 DC reactor
43 diode
44 second voltage sensor
45 second current sensor
46 capacitor
51 first calculation section
52 first adder
53 compensator
54 second adder
61 second calculation section
62 third adder
63 compensator
64 fourth adder
72 fifth adder
73 compensator
74 sixth adder
81, 82 storage battery
P circuit connection point
Qb1, Qb2, Qa1, Qa2 switching element
Q1 to Q4 switching element

The invention claimed is:

1. A conversion device that converts DC powers from a plurality of DC power supplies, to AC power and supplies the AC power to a load, the conversion device comprising:
a filter circuit connected to the load and including an AC reactor and a first capacitor;
a DC/AC inverter connected to the load via the filter circuit;
a plurality of DC/DC converters as a whole, which are provided between the respective plurality of DC power supplies and the DC/AC inverter;
a second capacitor provided between the DC/AC inverter and the plurality of DC/DC converters; and
a control unit configured to set a current target value for each of the plurality of DC/DC converters to thereby be synchronized with current of the AC power, based on voltage of the AC power, voltage variation due to current flowing through the AC reactor and an impedance thereof, reactive currents respectively flowing through the first capacitor and the second capacitor, and voltage of each DC power.

2. The conversion device according to claim 1, wherein the plurality of DC power supplies include at least one of a solar battery array and a storage battery, and
the control unit sets, based on the current target values, current target values to be allocated to the respective DC/DC converters, thereby causing the DC power supply that is the solar battery array to perform corresponding output and causing the DC power supply that is the storage battery to be charged or discharged accordingly.

3. The conversion device according to claim 2, wherein in a case where a number corresponding to each of the plurality of DC power supplies is i (=1, 2, . . . ), a target value for output current from each DC power supply to the load is Ia.i*, a capacitance of the first capacitor is Ca, a voltage value of the AC power is Va, voltage based on each of the plurality of DC power supplies is $V_{DC}.i$, and a Laplace operator is s, the control unit sets an AC output current target value Iinv* for the DC/AC inverter at a circuit connection point between the filter circuit and the DC/AC inverter, to a value obtained by adding reactive current flowing through the first capacitor and a summation of Ia.i*, in a case where an impedance of the AC reactor is Za, the control unit sets an AC output voltage target value Vinv* for the DC/AC inverter at the circuit connection point, as follows:

$$Vinv^* = Va + ZaIinv^*,$$

the control unit sets the greater one of the voltage $V_{DC}.i$ and an absolute value of the AC output voltage target value Vinv* for the DC/AC inverter, as an output voltage target value Vo* for the DC/DC converter, and in a case where a capacitance of the second capacitor is C, the control unit sets a current target value Iin.i* for the DC/DC converter, as follows:

$$Iin.i^* = [Ia.i^* \times Vinv^* + Ki\{(sCaVa)Vinv^* + (s\,CVo^*) \times Vo^*\}]/V_{DC}.i$$

where Ki is a given group of constants that satisfies $\Sigma Ki = 1$.

4. The conversion device according to claim 2, wherein
the plurality of DC/DC converters each include a DC reactor, and
voltage obtained by subtracting voltage variation due to current flowing through each DC reactor and an impedance thereof from voltage Vg.i of each DC power supply is used as voltage of each DC power or voltage $V_{DC}.i$.

5. The conversion device according to claim 1, wherein
in a case where a number corresponding to each of the plurality of DC power supplies is i (=1, 2, ... ), a target value for output current from each DC power supply to the load is Ia.i*, a capacitance of the first capacitor is Ca, a voltage value of the AC power is Va, voltage based on each of the plurality of DC power supplies is $V_{DC}.i$, and a Laplace operator is s, the control unit sets an AC output current target value Iinv* for the DC/AC inverter at a circuit connection point between the filter circuit and the DC/AC inverter, to a value obtained by adding reactive current flowing through the first capacitor and a summation of Ia.i*,
in a case where an impedance of the AC reactor is Za, the control unit sets an AC output voltage target value Vinv* for the DC/AC inverter at the circuit connection point, as follows:

$$Vinv^* = Va + Za\,Iinv^*,$$

the control unit sets the greater one of the voltage $V_{DC}.i$ and an absolute value of the AC output voltage target value Vinv* for the DC/AC inverter, as an output voltage target value Vo* for the DC/DC converter, and
in a case where a capacitance of the second capacitor is C, the control unit sets a current target value Iin.i* for the DC/DC converter, as follows:

$$Iin.i^* = [Ia.i^* \times Vinv^* + Ki\{(sCaVa)Vinv^* + (s\,CVo^*) \times Vo^*\}]/V_{DC}.i$$

where Ki is a given group of constants that satisfies $\Sigma Ki = 1$.

6. The conversion device according to claim 5, wherein
the plurality of DC/DC converters each include a DC reactor, and
voltage obtained by subtracting voltage variation due to current flowing through each DC reactor and an impedance thereof from voltage Vg.i of each DC power supply is used as voltage of each DC power or voltage $V_{DC}.i$.

7. The conversion device according to claim 1, wherein
the plurality of DC/DC converters each include a DC reactor, and
voltage obtained by subtracting voltage variation due to current flowing through each DC reactor and an impedance thereof from voltage Vg.i of each DC power supply is used as voltage of each DC power or voltage $V_{DC}.i$.

8. The conversion device according to claim 1, wherein the load is an AC power supply.

9. The conversion device according to claim 8, wherein power is supplied from the AC power supply to at least one of the plurality of DC power supplies.

10. The conversion device according to claim 1, wherein a SiC element is used for at least one of semiconductor switching elements included in the plurality of DC/DC converters and the DC/AC inverter.

* * * * *